(12) United States Patent
Li et al.

(10) Patent No.: US 11,709,194 B2
(45) Date of Patent: Jul. 25, 2023

(54) SYSTEMS AND METHODS FOR HIGH IMPEDANCE FAULT DETECTION IN ELECTRIC DISTRIBUTION SYSTEMS

(71) Applicant: General Electric Technology GmbH, Baden (CH)

(72) Inventors: Xiaoming Li, Stafford (GB); Hengxu Ha, Stafford (GB); Ling Xiang, Stafford (GB)

(73) Assignee: General Electric Technology GmbH, Baden (CH)

( * ) Notice: Subject to any disclaimer, the term of this patent is extended or adjusted under 35 U.S.C. 154(b) by 149 days.

(21) Appl. No.: 17/403,650

(22) Filed: Aug. 16, 2021

(65) Prior Publication Data

US 2023/0048196 A1 Feb. 16, 2023

(51) Int. Cl.
*G01R 31/08* (2020.01)
*G06N 20/00* (2019.01)
(Continued)

(52) U.S. Cl.
CPC .......... *G01R 31/088* (2013.01); *G06N 20/00* (2019.01); *H02H 1/0007* (2013.01); *H02H 1/0092* (2013.01); *H02H 7/22* (2013.01)

(58) Field of Classification Search
CPC .... G01R 31/086; G01R 31/088; G01R 31/52; G06N 20/00; H02H 1/0007; H02H 1/0092; H02H 7/22
(Continued)

(56) References Cited

U.S. PATENT DOCUMENTS

| 5,550,751 A | * | 8/1996 | Russell | H02H 1/0015 |
| | | | | 706/915 |
| 2005/0171647 A1 | * | 8/2005 | Kunsman | H02H 1/0092 |
| | | | | 700/293 |
| 2020/0393505 A1 | * | 12/2020 | Cui | H02H 7/22 |

FOREIGN PATENT DOCUMENTS

| CN | 102253293 A | * | 11/2011 |
| EP | 674793 A1 | | 10/1995 |
| WO | 1995/010815 A1 | | 4/1995 |

OTHER PUBLICATIONS

Machine translation of Cao et al. Chinese Patent Document CN 102253293 A Nov. 30, 2011 (Year: 2011).*

(Continued)

*Primary Examiner* — Kevin J Comber
(74) *Attorney, Agent, or Firm* — Eversheds Sutherland (US) LLP

(57) ABSTRACT

Systems, methods, and computer-readable media are disclosed for high impedance detection in electric distribution systems. An example method may include calculating, by a processor, a relative randomness of a signal, wherein the relative randomness is a derivative of a first scale wavelet transform divided by an energy of the signal. The example method may also include calculating, by the processor, one or more scales of a wavelet transform of the signal. The example method may also include calculating, by the processor, one or more energy ratios between energy of the wavelet transform in the one or more scales. The example method may also include calculating, by the processor, a zero-crossing phase difference between a third harmonic and a fundamental component of the signal. The example method may also include determining, by the processor, that a high impedance fault occurs based on at least one of: the relative randomness, a comparison between the one or more (Continued)

scales of the wavelet transform, and the zero-crossing phase difference.

18 Claims, 15 Drawing Sheets

(51) Int. Cl.
 *H02H 1/00* (2006.01)
 *H02H 7/22* (2006.01)
(58) Field of Classification Search
 USPC .......................................................... 361/78
 See application file for complete search history.

(56) References Cited

OTHER PUBLICATIONS

Extended European Search Report issued in EP Application No. 22190487.3 dated Jan. 25, 2023, 5 pages.
Vico et al.: High impedance fault detection on rural electric distribution systems. 2010 IEEE Rural Electric Power Conference (REPC), Orlando, FL, USA, 2010, pp. B3-B3-8, doi: 10.1109/REPCON.2010.5476205.
Ramezani et al.: Design and implementation of an adaptive High Impedance Fault relay. 2007 International Power Engineering Conference (IPEC 2007), Singapore, 2007, pp. 1131-1136.
Kawady et al.: Experimental investigation of high impedance faults in low voltage distribution networks. 2009 IEEE Power & Energy Society General Meeting, Calgary, AB, Canada, 2009, pp. 1-6, doi: 10.1109/PES.2009.5275248.

* cited by examiner

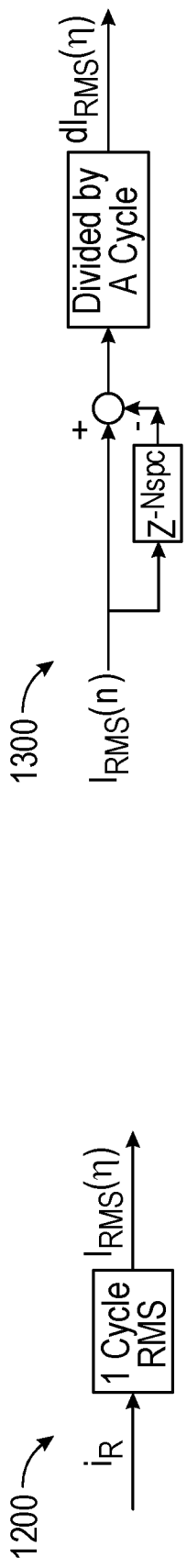
FIG. 12
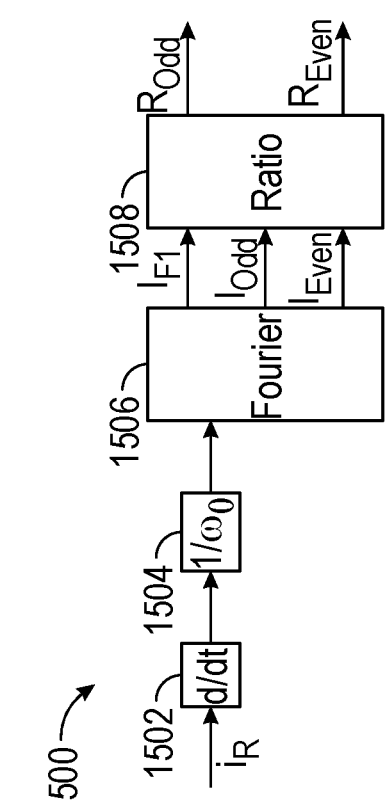
FIG. 13
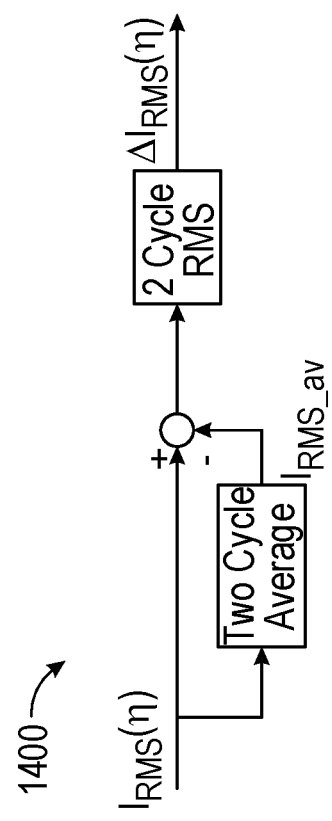
FIG. 14
FIG. 15

SYSTEMS AND METHODS FOR HIGH IMPEDANCE FAULT DETECTION IN ELECTRIC DISTRIBUTION SYSTEMS

FIELD OF DISCLOSURE

The present disclosure related to power distribution, and more particularly to systems and methods for high impedance fault detection.

BACKGROUND

Power distribution systems may sometimes be exposed to high impedance faults. Although systems may exist for detecting such faults, the accuracy of these systems may not be as effective as they could be. In particular, it may be problematic to more accurately detect high impedance faults because a characteristic of the current may vary based on the material of the surface (for example, grass, cement, asphalt, soil, etc.).

BRIEF DESCRIPTION OF THE DRAWINGS

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. In the drawings, the left-most digit(s) of a reference numeral may identify the drawing in which the reference numeral first appears. The use of the same reference numerals indicates similar, but not necessarily the same or identical components. However, different reference numerals may be used to identify similar components as well. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

FIG. 12 is a schematic diagram illustrating another example flow diagram, in accordance with one or more example embodiments of the disclosure.

FIG. 13 is a schematic diagram illustrating another example flow diagram, in accordance with one or more example embodiments of the disclosure.

FIG. 14 is a schematic diagram illustrating another example flow diagram, in accordance with one or more example embodiments of the disclosure.

FIG. 15 is a schematic diagram illustrating another example flow diagram, in accordance with one or more example embodiments of the disclosure.

DETAILED DESCRIPTION

Overview

Figure 1:
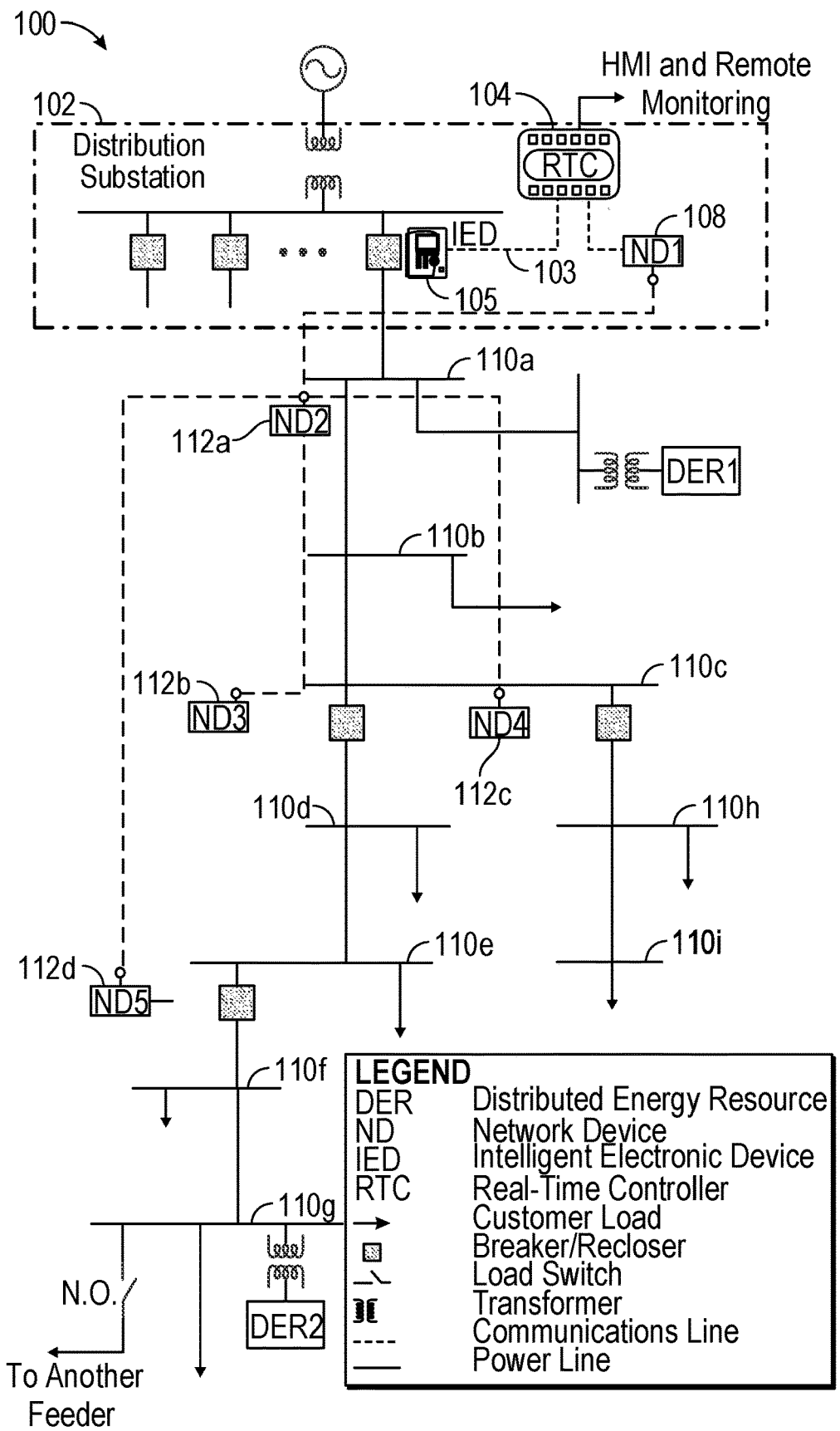
FIG. 1 is a schematic diagram of an example system, in accordance with one or more example embodiments of the disclosure.

This disclosure relates to, among other things, systems, methods, computer-readable media, techniques, and methodologies for high impedance detection to effectively detect high impedance faults. In some embodiments, this multi-algorithm and multi-rules approach for performing high impedance detection may, at a high level, include at least the following. First, algorithm preparation may be performed. Algorithm preparation may include applying a set of algorithms to one or more input signals. The one or more input signals may include, for example, the measured phase current, residual current, or produced residual current. In some cases, the algorithms may be applied to the one or more input signals in order to calculate at least the RMS current ($I_{RMS}$), derivative-of-RMS-based randomness ($dI_{RMS}$), increment-RMS-based randomness ($\Delta I_{RMS}$), odd and even order harmonics ratio to fundamental frequency ($R_{Odd}$, $R_{Even}$), amplitude of fundamental frequency (Amp_H1), amplitude of harmonics (Amp_H), amplitude of odd order harmonics (Amp_Odd), ratio of third harmonic to fundamental frequency (Amp_Ratio_H3_H1), zero-crossing phase difference between third harmonic and fundamental frequency (Phase_Diff_H3_H1), average wavelet energy ratio of scale 1 to scale 2 ($R_{WT1av}$), average wavelet energy ratio of scale 1 to scale 3, ($R_{WT2av}$) and/or wavelet-energy-based relative randomness ($RR_{WT1}$), among other information. Once calculated, this information (the terms "information" and "data" may be used interchangeably herein in some cases) may then be used in association with the one or more rules (described in further detail below) to determine if a fault condition exists.

In some embodiments, following the algorithm preparation, an effectiveness determination may be made. The effectiveness determination may involve analyzing the input data (for example, the one or more input signals and/or any of the data obtained through the algorithm preparation) to determine if the data is usable for performing high impedance detection, or if the data is simply noise or other unusable types of data. The input to the effectiveness determination may include the measured phase current or residual current or produced residual current. The effectiveness determination may filter out most of the noises and signals generated by normal operations for sake of higher security to avoid maloperation on loads, breaker operations or noises.

In some embodiments, once it is determined that the data is usable for performing high impedance detection, a series of rules may be used to identify if an arcing fault exists. This rule system may be an open system upon which the new rules for the arcing fault detection with high security can be added and/or removed. As described herein, six rules may be utilized for this purpose, however, this is not intended to be limiting, and any other number of rules may also be used in the high impedance fault detection. Additionally, some or all of the rules may be weighted. For example, a first rule may be afforded a greater weight than a second rule. The outputs of the rules may include numerical values, such that the weighting may simply involve multiplying an output of a rule by a weighting factor, which may also be a numerical value. However, the outputs of the rules may be in any other form, and the weighting may be applied in any other manner as well. This weighting may be performed as part of an intelligent decision making system, such as an artificial intelligence system, a machine learning system, or the like. In this regard, the weights associated with different rules may also be adaptive. For example, different rules may be designed to be adaptive to different scenarios, such as arcing faults via soil, asphalt, concrete, etc. In this regard, the weights applied to different rules may change over time such that individual rules may be afforded different weights. Additionally, while a first rule may initially be provided a greater weight than a second rule at a first time, based on data received by the system, the second rule may eventually adapt to be provided greater weight than the first rule (for example, if it is determined that an output of the second rule is more indicative of a fault existing). This system may also involve additional analysis with an ultimate output being an indication of whether a fault exists or not. High-level examples of how these rules may be used in conjunction with the intelligent decision making system to produce the indication of whether a fault exists may be further illustrated in at least FIGS. 3 and 11 (described in additional detail below).

In some embodiments, a first rule may include a first randomness algorithm (which may be referred to as "randomness 1" herein). The first randomness algorithm may involve which may be a $$\frac{dI}{dt}$$

increment, or a derivative-of-RMS-based randomness. When there is an intermittent arcing fault, a continuous fluctuation may be reflected by this $$\frac{dI}{dt}$$

value. The $$\frac{dI}{dt}$$

value may be a derivative of a root mean square (RMS) of current in one cycle. Under normal operation, the $$\frac{dI}{dt}$$

may be around zero. If the $$\frac{dI}{dt}$$

exceeds a threshold value (for example, 6 A/s, or any other value), it may be determined that an abnormal condition is taking place (for example, an arcing fault). When the $$\frac{dI}{dt}$$

value is oscillating from positive to negative values for a certain period, it may also be determined that an abnormal condition is taking place. This first rule may be further exemplified in FIGS. 6 and 13, which may be described below in further detail.

In some embodiments, a second rule may be a second randomness algorithm (which may be referred to as "randomness 2" herein), which may be increment-RMS-based randomness, and may be based on the variation of the average value of RMS of the input current. The randomness 2 may also be referred to as a wavelet energy ratio that may include an energy ratio between scales of wavelet transform energy of an original input signal. A first ratio may be the energy ratio of scale 1 to scale 2, and the a second ratio may be the energy ratio of scale 1 to scale 3. This may be suitable for such scenario where the RMS of input current (secondary) is higher than a given threshold current (for example, 0.1 mA, or any other value). When a randomness ($\Delta I_{RMS}$) is higher than a threshold percentage (for example, 10 percent or any other percentage) of $I_{RMS}$ itself, and the average wavelet energy ratio follows certain relationship, it may be determined as an arcing fault. This second rule may be further exemplified in FIGS. 7 and 14-15, which may be described below in further detail.

In some embodiments, a third rule may involve a wavelet-energy-ratio based relative randomness of scale 1 wavelet energy. The relative randomness of wavelet energy of scale 1 may be calculated (for example using the algorithm 1900 depicted in FIG. 19), and the resulting value may reflect the variation of the highest frequency band associated with the sampling frequency. During the arcing fault, the high frequency part may take a relative higher proportion compared with the normal operation, and this proportion may vary when the frequency band is different. The threshold may also vary when this rule is used at different sampling frequency scenario. This third rule may be further exemplified in FIGS. 8 and 19, which may be described below in further detail.

In some embodiments, a fourth rule may be based on a phase difference between a third harmonic and a fundamental frequency component at the zero-crossing of the fundamental current. When there is an arcing fault, the third harmonic may lead the first harmonic when the first harmonic is at zero degree. This fourth rule may be further exemplified in FIGS. 10, 15, and 17, which may be described below in further detail.

In some embodiments, a fifth rule may be a combination of harmonic and wavelet energy ratio which may be used to distinguish most of the fault scenarios from noise and normal operation status. This fifth rule may be further exemplified in FIGS. 9 and 16, which may be described below in further detail.

In some embodiments, the sixth rule may involve an option for adding new designed rules to adapt for the new specific scenarios.

In some embodiments, the outputs of the six rules described above (as well as any other number of rules) may be provided to a logic OR gate. In this manner, if any of the rules are satisfied, then an indication may be output that a fault may have occurred. However, in other embodiments, the rules may be provided as inputs to an intelligent decision making system (for example, the intelligent decision maker 1114 illustrated in FIG. 11). In such embodiments, artificial intelligence, machine learning, and the like may be used to determine whether a high impedance fault has occurred. For example, using the artificial intelligence, machine learning, etc., the different rules may be provided different weightings. The intelligent decision making system may be pre-trained with data, and may also be trained in real-time with actual data. For example, the intelligent decision-making system may provide an indication of whether a fault has occurred based on actual data, and feedback may be provided to the system in the form of an indication if a fault actually exists. The intelligent decision-making system may then use this data to adjust a model used for such determinations (for example, the intelligent decision-making system may adjust the weightings provided to the different rules, among any other types of adjustments). In this manner, the artificial intelligence, machine learning, etc., may be self-adaptive in continuously identifying the optimal weightings to utilize at a given time.

In some embodiments, individual confirmation logic is applied to the output of each rule for picking up arcing fault. All of the outputs after the confirmation logic are connected to an OR gate to get the final result.

In some embodiments, the approach described herein may provide a number of advantages. For example, the approach may provide extremely high sensitivity to detect the arcing faults (for example, even when fault currents are as low as 5 mA). The approach may also include extremely high security and no maloperation based on noisy data. Either the phase current or residual current from core balanced CT or residual current produced by measured one or more phase currents can be the input for the scheme. The approach may be also used in the incipient fault alarm with minor adjustment of the threshold. The approach may be designed by selecting effective signals plus rules for picking up different kind of arcing faults. This may be an open scheme in which the rules can be added and/or removed individually. Wavelet multiresolution analysis, randomness energy, zero-crossing phase difference, etc. may be combined in the system to guarantee the reliability and stability. The approach can also apply on incipient fault detection for both overhead line and cables. The approach may also be accommodated for various sampling rate from 24 number of samples per cycle to 64 number of samples per cycle.

Turning to the figures, FIG. 1 is a schematic diagram of an example use case illustrating high impedance fault detection in accordance with one or more example embodiments of the disclosure. As shown in FIG. 1, a high impedance fault detection system 100 may include a controller 104 (e.g., a real-time controller, a substation gateway, a processor, or the like), an IED 105 (e.g., relay, a phasor measurement unit, or device that measures currents in one or more phases), and a data exchange medium 103 (e.g., Fiber, Ethernet, wireless, hardwires, or the like). The IED 105 may be located proximate to or at the feeder head 102 of a feeder (e.g., a distribution substation, or the like). For example, the IED 105 may measure data of the whole feeder having a feeder main and/or one or more branches. The controller 104 may compare data measured by the IED 105 with a single threshold setpoint, and/or an adaptive threshold setpoint to determine if a high impedance fault condition occurs in the feeder main and/or branches of the feeder, as further described herein.

In some embodiments, the high impedance fault detection system 100 may include multiple IEDs. As shown in FIG. 1, the high impedance fault detection system 100 may further include IEDs 106a-106c, and network devices 108, 112a-112d as indicated in the dash boxes. The controller 104 may collect data from the IED 105 and IEDs 106a-106c via the network devices 108, and 112a-112d. In some embodiments, the IEDs 106a-106c may be one of the embodiments of the IED 105. The network devices 112a-112d may be one of the embodiments of the network device 108. The controller 104 may process the data to monitor one or more changes of impedances in overhead lines/branches 110a-110i. The IED 105 may be used to detect a high impedance fault on the feeder Main (including main branches 110a and 110b) close to the feeder head 102. The IED 106a may be located proximate to or at a second branch to collect its data and cover branches with loads less than the threshold percent (e.g., overhead lines 110c-110e). Similarly, the IED 106b may be located proximate to or at a third branch (e.g., overhead lines 110f and 110g), and the IED 106c may be located proximate to or at a fourth branch (e.g., overhead lines 110h and 110i). The controller 104 may gather data from the IED 105, and the IEDs 106a-106c via the network devices 108 and 112a-112d to determine a high impedance fault condition in a particular branch. The controller 104 may compare data from each of the IED 105 and the IEDs 106a-106c with a single threshold setpoint and/or an adaptive threshold setpoint to determine if a high impedance fault condition occurs in a particular branch. Such additional IEDs 106a-106c may provide an additional coverage of branches that have small loads (e.g., branches having loads less than the threshold percent).

Figure 2:
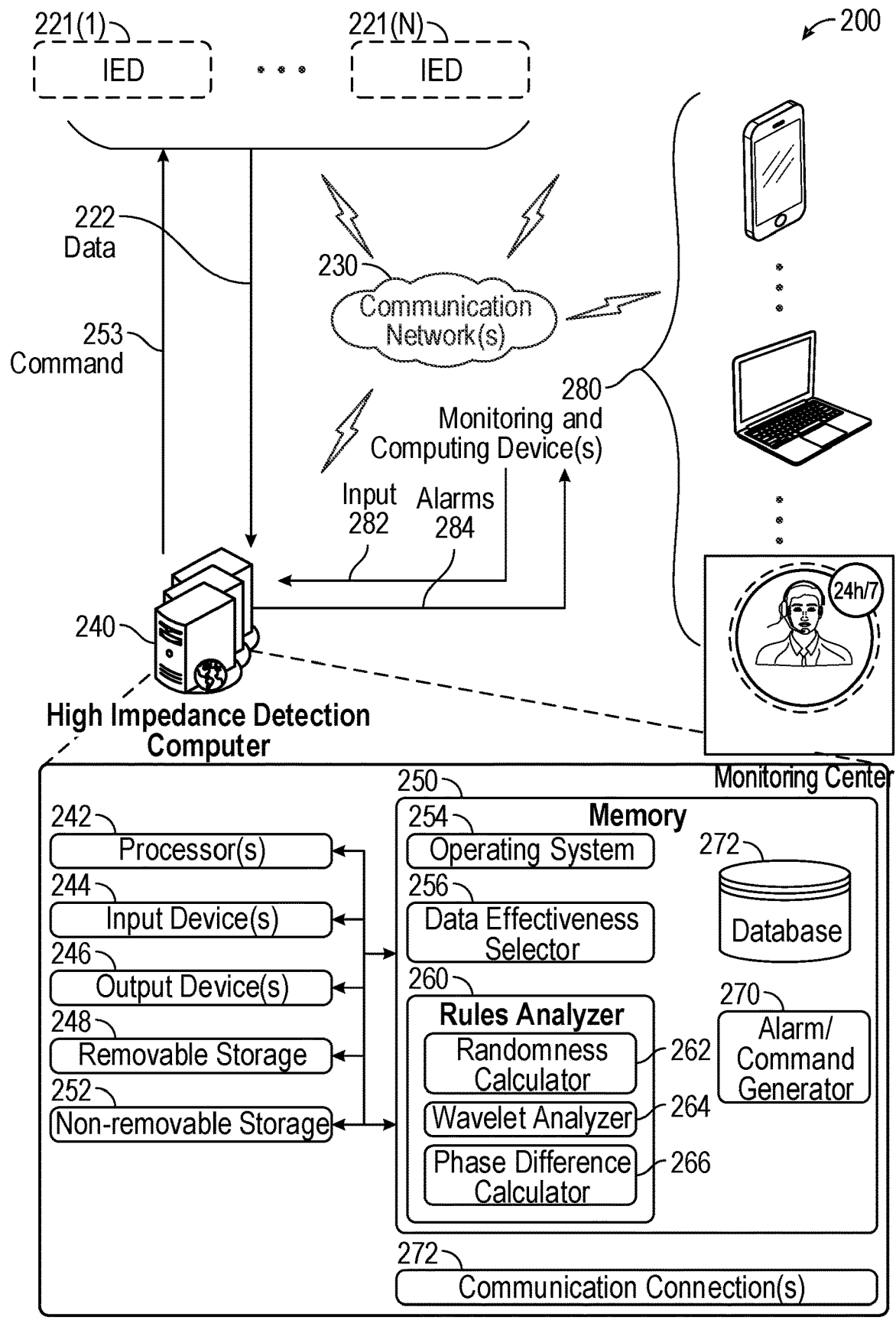
FIG. 2 is a schematic illustration of another example system, in accordance with one or more example embodiments of the disclosure.

FIG. 2 is a schematic illustration of an example high impedance fault detection system 200 in accordance with one or more example embodiments of the disclosure.

As shown in FIG. 2, the high impedance fault detection system 200 may include one or more IEDs 220(1), . . . , 220(N) (e.g., the IEDs 105, 106a-106c of FIG. 1), a high impedance fault detection controller 240 (e.g., the controller 104 of FIG. 1), and one or more monitoring and computing devices 280.

In an illustrative configuration, an IED may be a protective device configured to measure impedance values of overhead lines. In that case, a distributed architecture may be implemented without a need to an additional real-time controller, when IEDs are time-coordinated with proper margin. Alternatively, an IED may stream out one or more phasor measurements (also referred to as synchrophasor) that may estimate the magnitude and phase angle of an electrical phasor quantity (such as voltage or current) in the overhead lines using a common time source for synchronization, and may also determine the impedance values using the phasor measurements. Examples of an IED may also include a phasor measurement unit (PMU) and/or any suitable device that performs the impedance and/or phasor measurements. In some embodiments, the high impedance fault detection system 200 may include a single IED 220(1) that may be located proximate to or at a feeder head of a feeder (e.g., a distribution substation, or the like), or may have been already installed at the feeder. The high impedance fault detection system 200 may detect high impedance fault conditions for multiple feeders. For example, the high impedance detection system may include the single IED 220(1) for each of the feeders. In some embodiments, as shown in FIG. 2, the high impedance fault detection system 200 may further include one or more IEDs per feeder, e.g., IEDs 220(2), . . . , 220(N) in addition to the IED 220(1), and 221(1), . . . , 221(N) as indicated in the dash lines. The IED 220(1) may be placed as described above. The remaining IEDs may be located at different branches along the downstream of one or more feeders. As shown in FIG. 2, a first group 210(1) of IEDs may be distributed along a first feeder, and a second group 210(2) of IEDs may be distributed along a second feeder. The IEDs 220(1), . . . , 220(N), and 221(1), . . . , 221(N) may send synchrophasor data to the high impedance detection controller 240 via a communication network 230.

The high impedance fault detection controller 240 (also referred to as controller 240) may be configured to communicate with one or more IEDs 220 and 221, and the one or more monitoring and computing devices 280. The controller 240 may be any type of computing devices, such as, but not limited to, real-time computing devices, real-time gateway devices, computers, and/or servers. The controller 240 may include one or more servers, perhaps arranged in a cluster, as a server farm, or as individual servers not associated with one another.

The controller 240 may include at least a memory 250 and one or more processing units (or processors) 242. The processors 242 may be implemented as appropriate in hardware, software, firmware, or combinations thereof. Software or firmware implementations of the processors 242 may include computer-executable or machine-executable instructions written in any suitable programming language to perform the various functions described (e.g., in real time).

The memory 250 may store program instructions that are loadable and executable on the processors 242, as well as data generated during the execution of these programs. Depending on the configuration and type of the controller 240, the memory 250 may be volatile (such as random access memory (RAM)) and/or non-volatile (such as read-only memory (ROM), flash memory, etc.). The controller 240 or server may also include additional removable storage 248 and/or non-removable storage 252 including, but not limited to, magnetic storage, optical disks, and/or tape storage. The disk drives and their associated computer-readable media may provide non-volatile storage of computer-readable instructions, data structures, program modules, and other data for the computing devices. In some implementations, the memory 250 may include multiple different types of memory, such as static random access memory (SRAM), dynamic random access memory (DRAM), or ROM.

The memory 250, the removable storage 248, and the non-removable storage 252 may be all examples of computer-readable storage media. For example, computer-readable storage media may include volatile and non-volatile, removable and non-removable media implemented in any method or technology for the storage of information such as computer-readable instructions, data structures, program modules, or other data. The memory 250, the removable storage 248, and the non-removable storage 252 may be all examples of computer storage media. Additional types of computer storage media that may be present include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the desired information and which can be accessed by the controller 240 or other computing devices. Combinations of any of the above should also be included within the scope of computer-readable media.

Alternatively, computer-readable communication media may include computer-readable instructions, program modules, or other data transmitted within a data signal, such as a carrier wave, or other transmissions. However, as used herein, computer-readable storage media does not include computer-readable communication media.

The controller 240 may also contain communication connection(s) 270 that allows the controller 240 to communicate with a stored database, another computing/storage device or server, user terminals, the IEDs 220 and 221, the computing devices 280, and/or other devices on the communication network 230. The controller 240 may also include input device(s) 244 such as a keyboard, a mouse, a pen, a voice input device, a touch input device, etc., and output device(s) 246, such as a display, speakers, printers, etc.

Turning to the contents of the memory 250 in more detail, the memory 250 may include an operating system 254 and one or more application programs or services for implementing the features disclosed herein, including a data effectiveness selector 256, a rules analyzer 260, a randomness calculator, a wavelet analyzer 264, a phase difference calculator 266, and/or an alarm/command generator 270. In some instances, the data effectiveness selector 256, a rules generator 260, a randomness calculator, a wavelet analyzer 264, a phase difference calculator 266, and/or an alarm/command generator 270 may receive, transmit, and/or store information in the database 272. It should be noted that the data effectiveness selector 256, a rules analyzer 260, a randomness calculator, a wavelet analyzer 264, a phase difference calculator 266, and/or an alarm/command generator 270 may be exemplary modules used to perform any of the functionality described herein for performing high impedance fault detections. However, any other number and or combinations of different types of modules may also be used as well. That is, including the data effectiveness selector 256, a rules analyzer 260, a randomness calculator, a wavelet analyzer 264, a phase difference calculator 266, and/or an alarm/command generator 270 is not intended to be limiting in terms of the modules that may exist in the memory 250.

In some embodiments, the data effectiveness selector 256 may involve analyzing the input data (for example, the one or more input signals and/or any of the data obtained through the algorithm preparation) to determine if the data is usable for performing high impedance detection, or if the data is simply noise or other unusable types of data. The input to the effectiveness determination may include the measured phase current or residual current or produced residual current. The effectiveness determination may filter out most of the noises and signals generated by normal operations for sake of higher security to avoid maloperation on loads, breaker operations or noises. The rules analyzer 260 (and the modules included within the rules analyzer 260, such as the randomness calculator 262, wavelet analyzer 264, and/or the phase difference calculator 266) may perform any of the operations described herein with respect to any of the figures (for example, utilizing the six rules to determine if an arcing fault exists.

The communication network 230 may transmit or receive data and/or instructions among the IEDs 220/221, the controller 240, and the monitoring and computing devices 280 using a transmission medium via the network interface device/transceiver utilizing any one of a number of transfer protocols (e.g., frame relay, internet protocol (IP), transmission control protocol (TCP), user datagram protocol (UDP), hypertext transfer protocol (HTTP), etc.). Example communications networks may include a local area network (LAN), a wide area network (WAN), a packet data network (e.g., the Ethernet), mobile telephone networks (e.g., cellular networks), plain old telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, the network interface device/transceiver may include one or more physical jacks (e.g., Ethernet, coaxial, or phone jacks) or one or more antennas to connect to a communications network. In an example, the network interface device/transceiver may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the IEDs 220/221, the controller 240, and the monitoring and computing devices 280 and includes digital or analog communications signals or other intangible media to facilitate communication of such software. In some embodiments, the network 230 may include a cable-based network.

Figure 3:
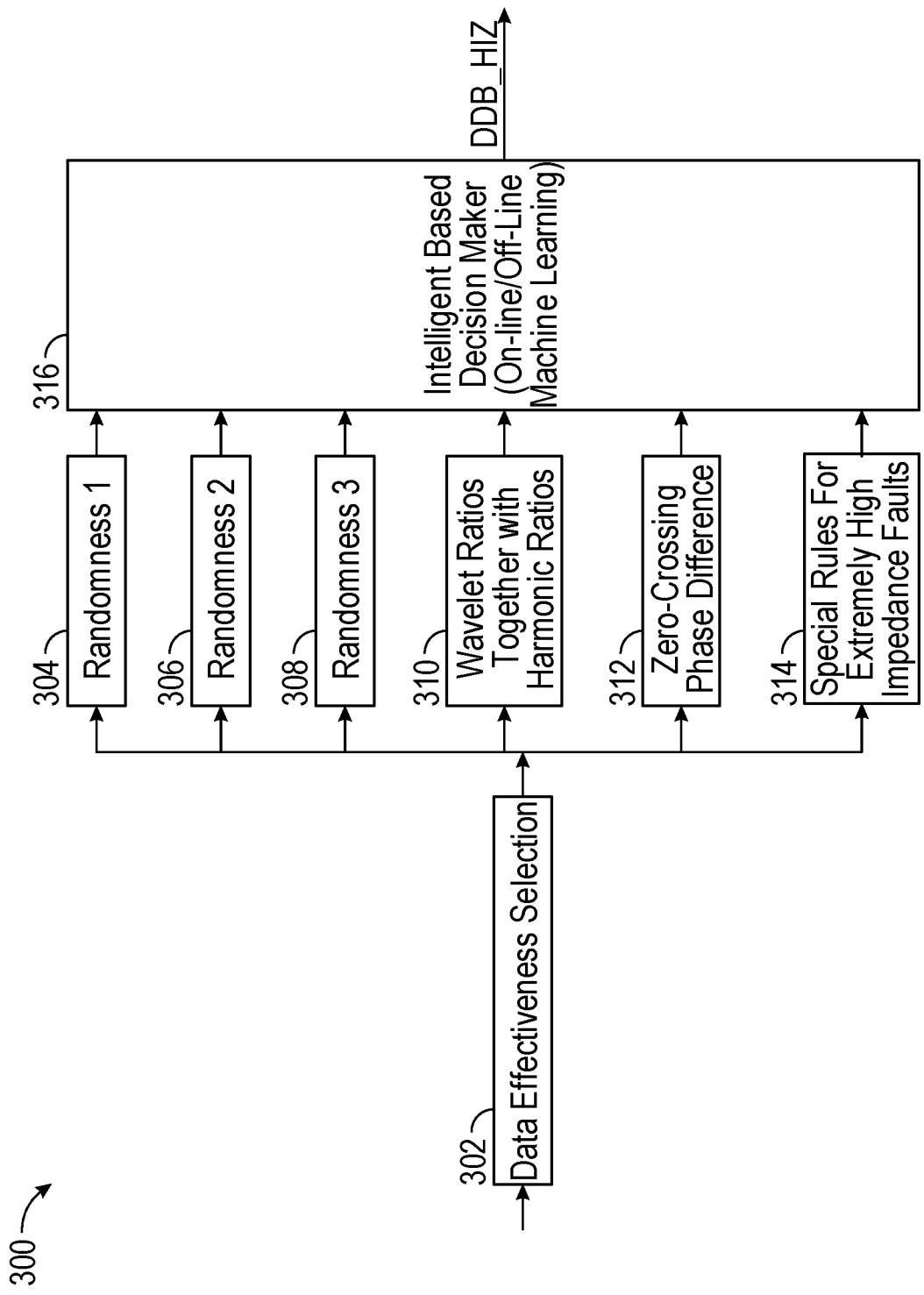
FIG. 3 is a schematic diagram of an example flow diagram, in accordance with one or more example embodiments of the disclosure.

FIG. 3 is a schematic diagram of an example flow diagram 300, in accordance with one or more example embodiments of the disclosure. The flow diagram 300 may be a high-level flow diagram that illustrates various operations performed to detect faults as described herein. A more detailed flow-diagram may also be illustrated in FIG. 11, described in additional detail below.

In some embodiments, the flow diagram 300 may initiate with operation 302, which may involve making a data effectiveness selection. The data effectiveness selection may involve analyzing the input data (for example, the one or more input signals and/or any of the data obtained through the algorithm preparation) to determine if the data is usable for performing high impedance detection, or if the data is simply noise or other unusable types of data. The input to the effectiveness determination may include the measured phase current or residual current or produced residual. The effectiveness determination may filter out most of the noises and signals generated by normal operations for sake of higher security to avoid maloperation on loads, breaker operations or noises. Additional details about the data effectiveness selection may be presented in FIGS. 5 and 16.

In some embodiments, following the data effectiveness selection of operation 302, the flow diagram 300 may proceed to perform operations in association with one or more rules. For example, the flow diagram 300 may depict six different rules that may be applied in operations 304-314 respectively. These rules may include a "randomness 1" rule applied in operation 304, a "randomness 2" rule applied in operation 306, a "randomness 3" rule applied in operation 308, a wavelet ratios and harmonic ratios rule applied in operation 310, a zero-crossing phase difference rule applied in operation 312, and/or special rule(s) for extremely high impedance faults applied in operation 314. The logic used in association with these different rules may be illustrated in further detail in at least FIGS. 6-10, 13-17, and 19 (and/or any other figure).

In some embodiments, the "randomness 1" rule applied in operation 304 may involve determining a derivative of RMS value of input current, dI/dt. The purpose of taking the derivative of the current may be to determine the amount of variation in the RMS value. This may allow for identification of an arcing fault, as an arcing fault may cause sever variations in the RMS value of the current. The dI/dt increment may be calculated as the derivative of the RMS current in one cycle (which may be shown in the second algorithm depicted in FIG. 13. Under normal operation, this $$\frac{dI}{dt}$$

should be around zero. However, when the $$\frac{dI}{dt}$$

is higher than a threshold value (for example, 6 A/s, or any other value), this may be indicative of an abnormality. when the $$\frac{dI}{dt}$$

is oscillating from positive to negative within certain value for a certain period, this may also be indicative of an abnormality. Additional details about the "randomness 1" rule may be presented in FIG. 6.

In some embodiments, the "randomness 2" rule applied in operation 306 may be increment-RMS-based randomness, and may be based on the variation of the average value of RMS of the input current. The randomness 2 may also be referred to as a wavelet energy ratio that may include an energy ratio between scales of wavelet transform energy of an original input signal. The ratio 1 may be the energy ratio of scale 1 to scale 2, and the ratio 2 may be the energy ratio of scale 1 to scale 3. This may be suitable for such scenario where the RMS of input current (secondary) is higher than a given threshold current (for example, 0.1 mA, or any other value). When a randomness ($\Delta I_{RMS}$) is higher than a given percentage (for example, 10%) of $I_{RMS}$ itself, and the average wavelet energy ratio follows certain relationship, it may be determined as an arcing fault. This third rule may be further exemplified in FIGS. 7 and 14-15, which may be described below in further detail.

In some embodiments, the randomness 3 rule applied in operation 308 may be a wavelet-energy-ratio-based relative randomness. As illustrated in the eighth algorithm of FIG. 19, the relative randomness of wavelet energy of scale 1 may be calculated, the value of which may reflect the variation of the highest frequency band related with the sampling frequency. During an arcing fault, the high frequency portion may take relative higher proportion compared with a normal operation, and this proportion may vary when the frequency band is different. The threshold may vary when this rule is used at different sampling frequencies. Additional details about the wavelet ratios and harmonic ratios rule may be presented in FIGS. 8 and 19 as well.

Figure 10:
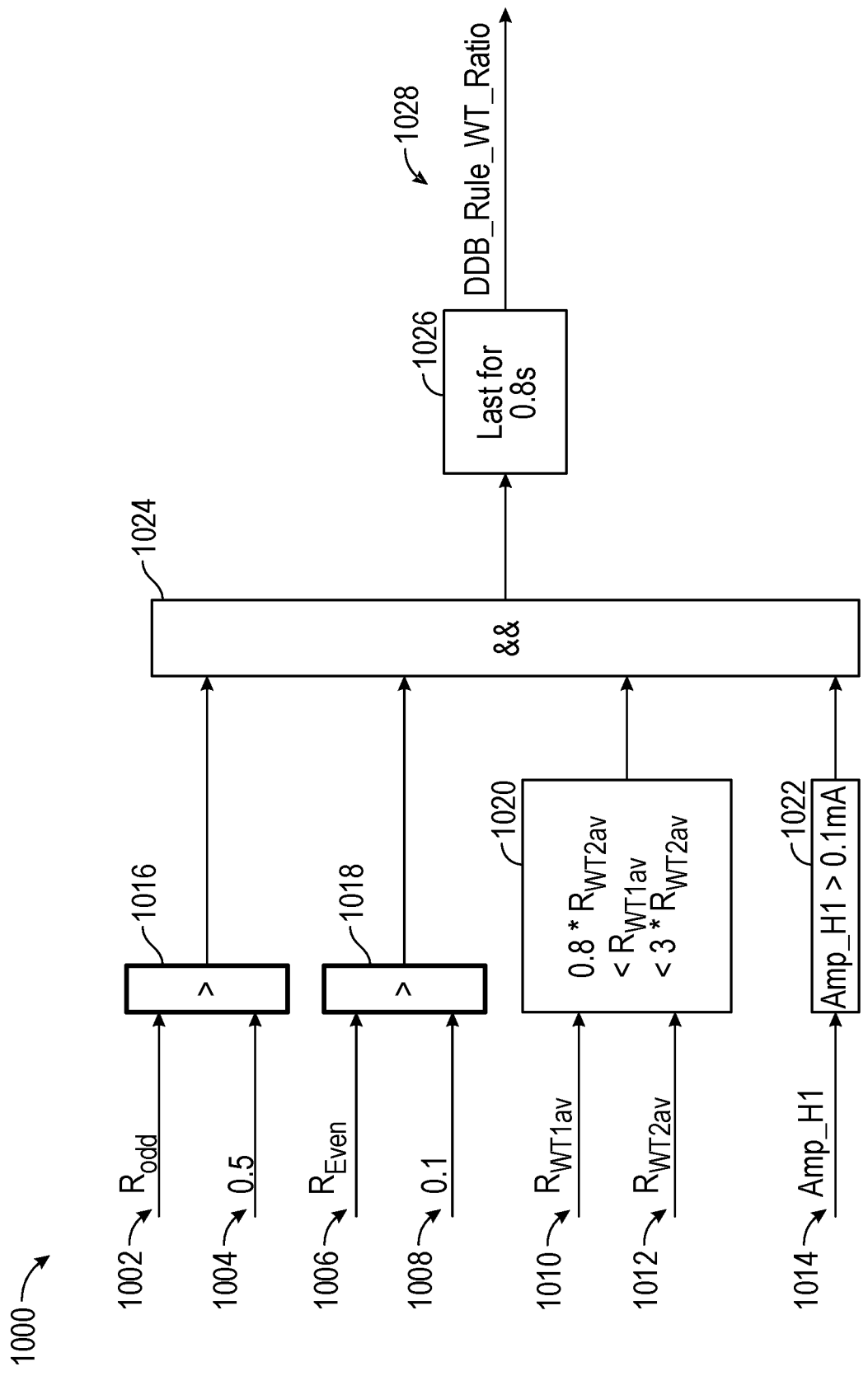
FIG. 10 is a schematic diagram illustrating another example flow diagram, in accordance with one or more example embodiments of the disclosure.
Figure 17:
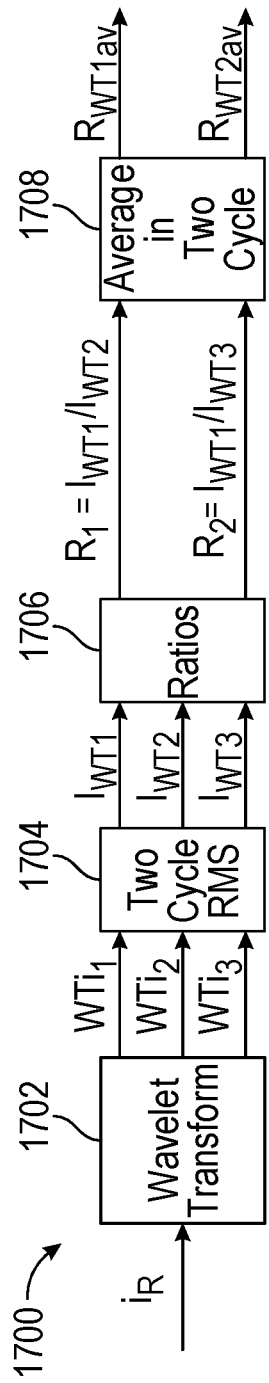
FIG. 17 is a schematic diagram illustrating another example flow diagram, in accordance with one or more example embodiments of the disclosure.
Figure 18:
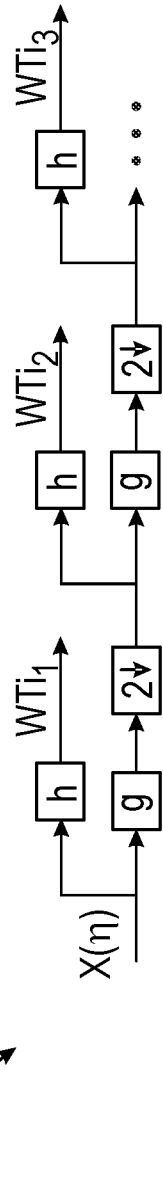
FIG. 18 is a schematic diagram illustrating another example flow diagram, in accordance with one or more example embodiments of the disclosure.

In some embodiments, the wavelet ratios and harmonic ratios rule applied in operation 310 may involve an odd harmonic ratio and an even harmonic ratio to the fundamental frequency component, together with a wavelet energy ratio of scale 1 to scale 2, $R_{WT1av}$ and wavelet energy ratio of scale 1 to 3, $R_{WT2av}$ As illustrated in the algorithm presented in FIG. 15 (the odd and even harmonic ratio to fundamental frequency), and the algorithm(s) presented in FIG. 17 (the algorithm for wavelet energy ratios calculation) and FIG. 18 (wavelet transform algorithm), during the arcing faults, the odd and even harmonic ratio may be higher than a threshold, and the wavelet energy ratio 1 may be within 0.8-3.0 times (or any other value) of ratio 2 (see FIG. 10). In some cases, this sixth rule associated with operation 314 may only be activated when the zero-sequence current is higher than a given threshold value (for example, 0.1 mA, or any other value). Additional details may be presented in FIGS. 15 and 17.

In some embodiments, a zero-crossing phase difference rule may be applied in operation 312. There may exist a particular relationship between the third harmonic and fundamental frequency components. During the arcing fault, the third harmonic may lead the first harmonic when the first harmonic is at zero degree. The comparison may only happens at the zero crossing of the phase for the fundamental, that means one value per cycle. Considering the measurement error, $-5°$ is used in the rule. When the original current is at different level, the threshold for the rule is different to make sure there is no maloperation under any circumstance. Threshold is not affected by the sampling rate. Additional details about the zero-crossing phase difference rule may be presented in FIGS. 9 and 16.

In some embodiments, the outputs of the six rules may be provided as inputs to operation 316, which may involve using an intelligent decision making system to determine if a high impedance fault likely exists. For example, the intelligent decision making system may involve the use of artificial intelligence, machine learning, or the like. As described above, another embodiment may simply involve the use of a logical OR gate, such that if any of the rules are satisfied, then an output may indicate that a fault has occurred, or has likely occurred. In some cases, the outputs of the rules and/or the output of the flow diagram 300 as a while may be numerical values. For example, an output of "1" for a rule may indicate that the rule was satisfied (for example, the rule may indicate that a fault has occurred or likely has occurred), and an output of "0" for a rule may indicate that the rule was not satisfied. Likewise, a final output of "1" may indicate that a fault has occurred and/or is occurring. However, the outputs may be in any other form as well. For example, the outputs may provide a fuzzy indication, such as a percentage likelihood that a fault has occurred (rather than simply providing a numerical value indicating that either a fault has or has not occurred). Additional implementation details regarding the intelligent decision making system may be presented in FIG. 11 as well.

Figure 4:
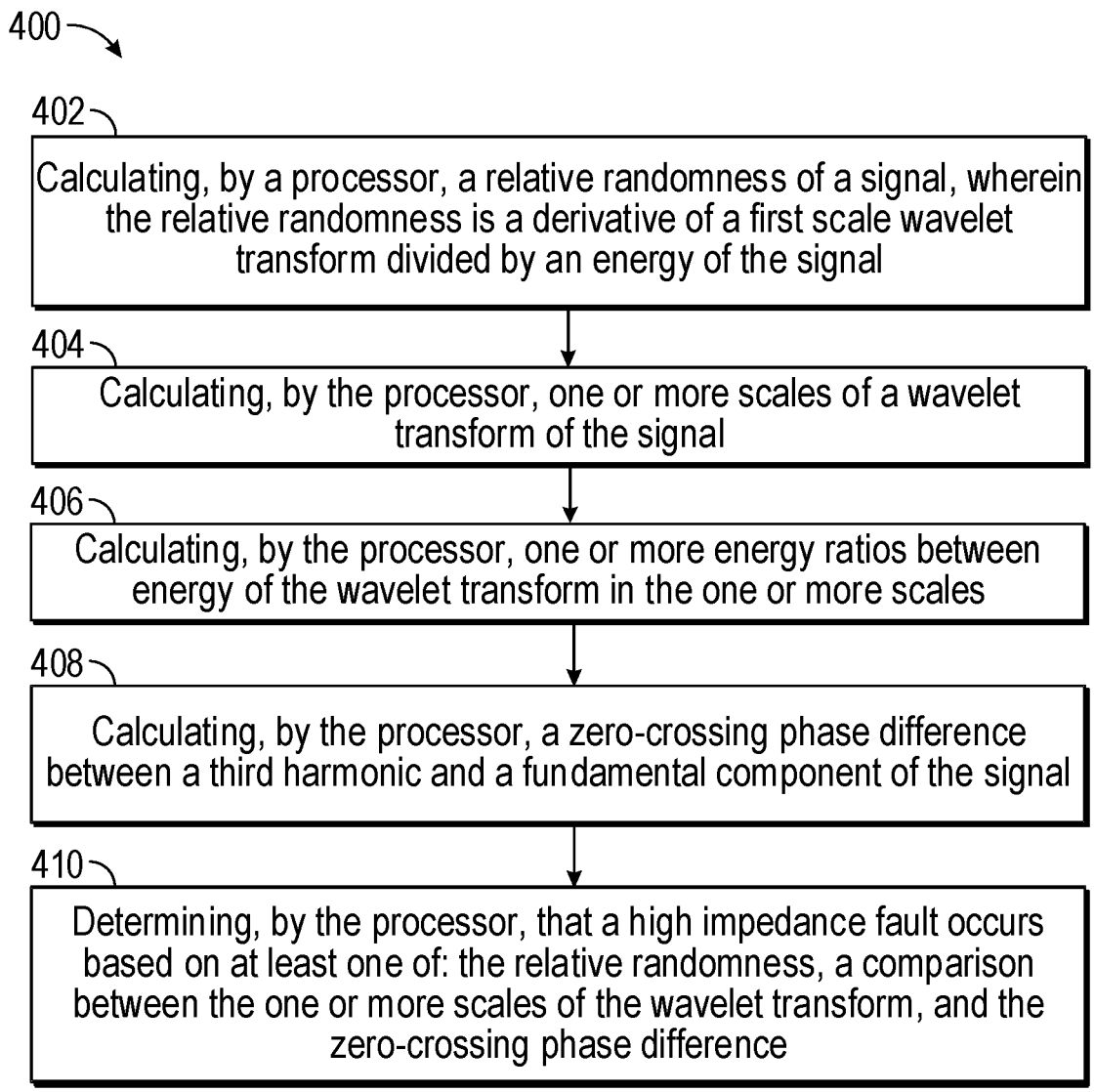
FIG. 4 is a schematic diagram of an example method, in accordance with one or more example embodiments of the disclosure.

FIG. 4 is an example process flow diagram of an illustrative method 400 for impedance-based high impedance fault detection in accordance with one or more example embodiments of the disclosure. In FIG. 4, computer-executable instructions of one or more module(s) (e.g., the controller 104/240) of the high impedance fault detection system 100/200 may be executed to perform high impedance fault detection.

At block 402 of the method 400 in FIG. 4, the method 400 may include calculating, by a processor, a relative randomness of a signal, wherein the relative randomness is a derivative of a first scale wavelet transform divided by an energy of the signal. Block 404 of the method 400 may include calculating, by the processor, one or more scales of a wavelet transform of the signal. Block 406 of the method 400 may include calculating, by the processor, one or more energy ratios between energy of the wavelet transform in the one or more scales. Block 408 of the method 400 may include calculating, by the processor, a zero-crossing phase difference between a third harmonic and a fundamental component of the signal. Block 410 of the method 400 may include determining, by the processor, that a high impedance fault occurs based on at least one of: the relative randomness, a comparison between the one or more scales of the wavelet transform, and the zero-crossing phase difference.

The operations described and depicted in the illustrative process flow of FIG. 4 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIG. 4 may be performed.

One or more operations of the process flow of FIG. 4 may have been described above as being performed by a user device, or more specifically, by one or more program modules, applications, or the like executing on a device. It should be appreciated, however, that any of the operations of process flow of FIG. 4 may be performed, at least in part, in a distributed manner by one or more other devices, or more specifically, by one or more program modules, applications, or the like executing on such devices. In addition, it should be appreciated that processing performed in response to execution of computer-executable instructions provided as part of an application, program module, or the like may be interchangeably described herein as being performed by the application or the program module itself or by a device on which the application, program module, or the like is executing. While the operations of the process flow of FIG. 4 may be described in the context of the illustrative high impedance fault detection controller, it should be appreciated that such operations may be implemented in connection with numerous other device configurations.

It should further be appreciated that the controller 104/240 may include alternate and/or additional hardware, software, or firmware components beyond those described or depicted without departing from the scope of the disclosure. More particularly, it should be appreciated that software, firmware, or hardware components depicted as forming part of the controller 104/240 are merely illustrative and that some components may not be present or additional components may be provided in various embodiments. While various illustrative program modules have been depicted and described as software modules stored in data storage, it should be appreciated that functionality described as being supported by the program modules may be enabled by any combination of hardware, software, and/or firmware. It should further be appreciated that each of the above-mentioned modules may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other modules. Further, one or more depicted modules may not be present in certain embodiments, while in other embodiments, additional modules not depicted may be present and may support at least a portion of the described functionality and/or additional functionality. Moreover, while certain modules may be depicted and described as sub-modules of another module, in certain embodiments, such modules may be provided as independent modules or as sub-modules of other modules.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Figure 5:
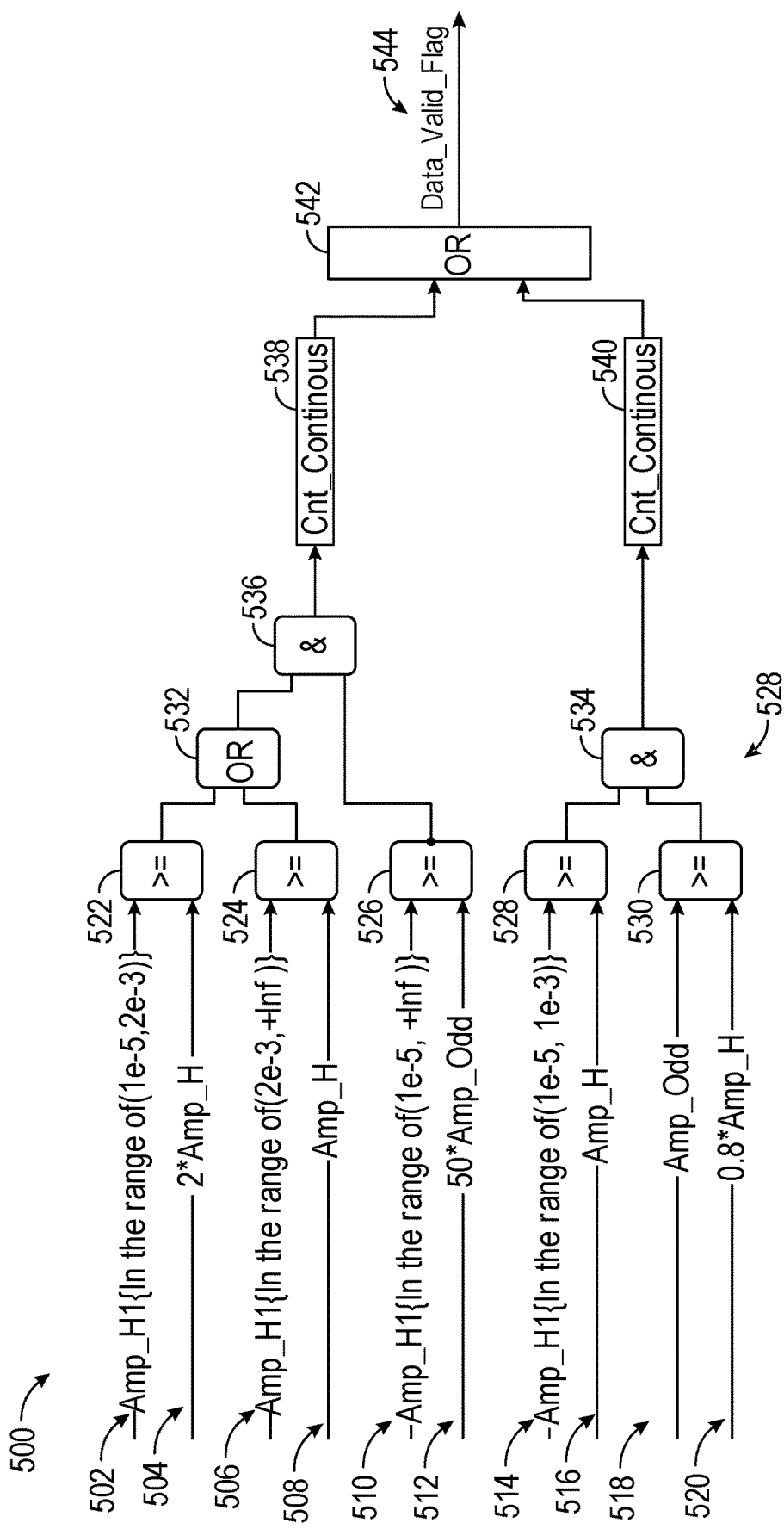
FIG. 5 is a schematic diagram illustrating an example flow diagram, in accordance with one or more example embodiments of the disclosure.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions. FIG. 5 is a schematic diagram illustrating an example flow diagram 500, in accordance with one or more example embodiments of the disclosure. Particularly, the flow diagram 500 may represent the data effectiveness selection as described above and depicted in FIG. 3. If it is an effective signal rather than noise, the fundamental component must be higher than a threshold. If the fundamental component is extremely low, it may not be a valid signal. If it is an arcing fault, then the fundamental component may not be very high either. Therefore, the valid effective data may be characterized by $I_{harm} < I_{AMH1} < 50 \ast I_{odd}$. The flow diagram 500 may include one or more inputs (for example, inputs 502-520), one or more conditions (for example, conditions 522-542), and an output (for example, output 544). The variables associated with the inputs may be defined above. The flow diagram 500 may include the following logic. A first condition 522 may involve determining if the amplitude of the fundamental frequency component in the range of less than $2 \ast 10^{-3}$ Amps and larger than $1 \ast 10^{-5}$ Ampere (that is, $1 \ast 10^{-5} < Amp\_H1 < 2 \ast 10^{-3}$) is larger than two times the amplitude of all harmonic components and less than 50 times of odd orders of harmonics ($50 \ast Amp\_Odd > Amp\_H1 > 2 \ast Amp\_H$). This range may also include any other values as well. A second condition 524 may involve determining if the amplitude of fundamental frequency is larger than $2 \ast 10^{-3}$ Amps. These two conditions may be provided to the logical OR gate 532, such that one of these conditions must be met. Additionally, the logical AND gate 536 may require that the condition 526 is also met. Condition 526 may involve determining if $50 \ast Amp\_Odd > Amp\_H1 > Amp\_H$. Additionally, condition 538 may require that these conditions continuously last for sufficient time (CNT_Continuous). If all of these conditions are met, then the data may be determined to be effective. Alternatively, conditions 528, 530, and 540 may also be met in order to determine that the data is effective (as indicated by the final logical OR gate 542). Conditions 528 and 530 may involve determining if the amplitude of fundamental frequency component larger than $1 \ast 10^{-5}$ and less than $1 \ast 10^{-3}$, and amplitude of odd harmonics is larger than 0.8 times of amplitude of all harmonics.

Figure 6:
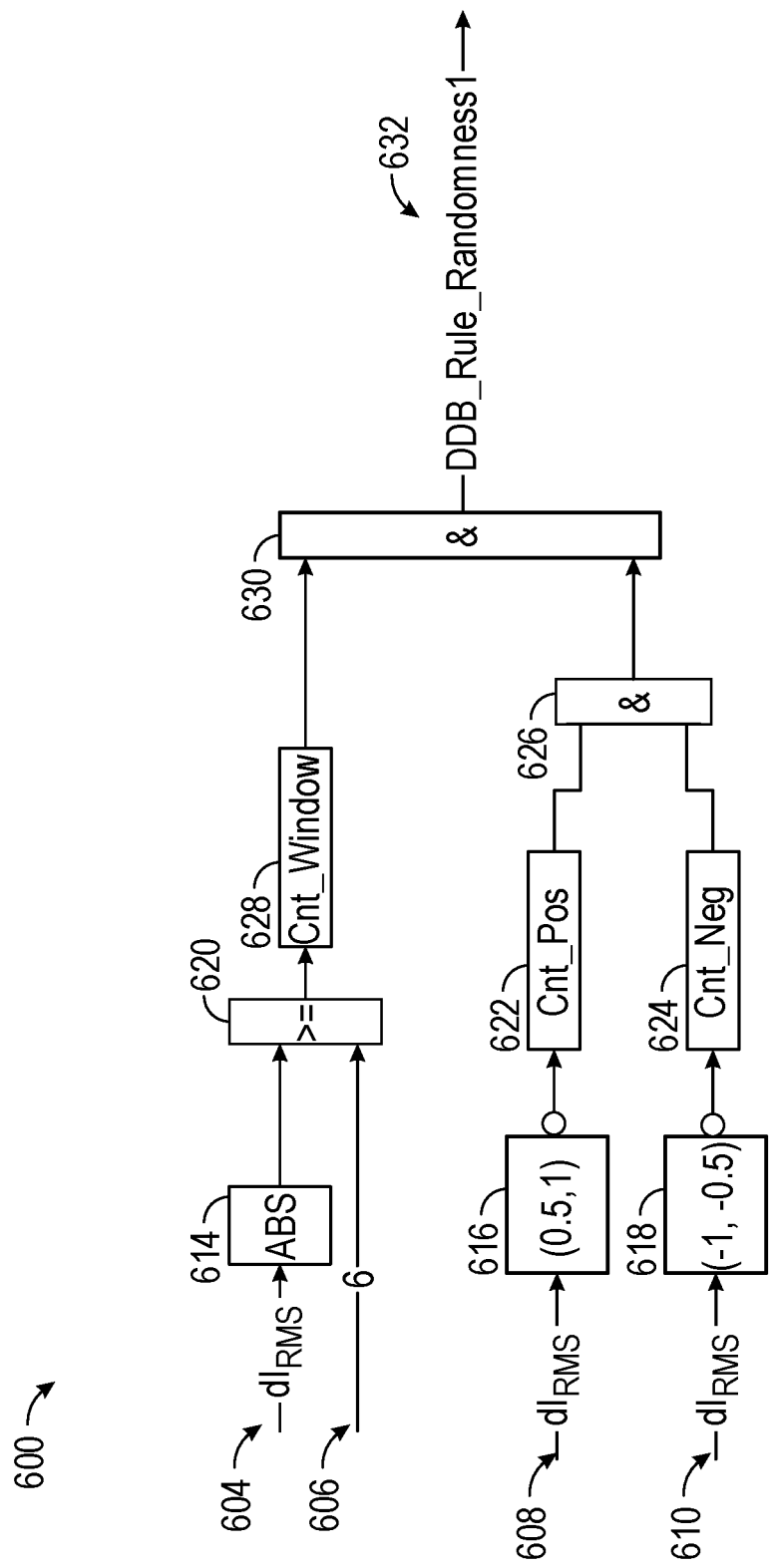
FIG. 6 is a schematic diagram illustrating another example flow diagram, in accordance with one or more example embodiments of the disclosure.

FIG. 6 is a schematic diagram illustrating an example flow diagram 600, in accordance with one or more example embodiments of the disclosure. Particularly, the flow diagram 600 may represent the "randomness 1" rule (for example, the first rule) as described above and depicted in FIG. 3. The flow diagram 600 may include one or more inputs (for example, inputs 604-610), one or more conditions (for example, conditions 614-630), and an output (for example, output 632). The flow diagram 600 may involve determining if the absolute value of $dI_{RMS}$ is larger than six and continuously lasts for sufficient time (for example, conditions 620 and 628). The flow diagram 600 may also involve determining that the value of $dI_{RMS}$ neither in the range of values including 0.5-1.0 or −1.0 to −0.5 (for example, conditions 616 and 618) Additionally, conditions 622 and 624 may involve determining if the input values 608 and 610 respectively remain continuously positive and continuously negative. If these conditions are met, and the conditions 620 and 628 are met (based on condition 630), then rule randomness 1 may determine that an arcing fault may exist, where DDB_Rule_Randomness1=1 (for example, the output may be equal to one).

Figure 7:
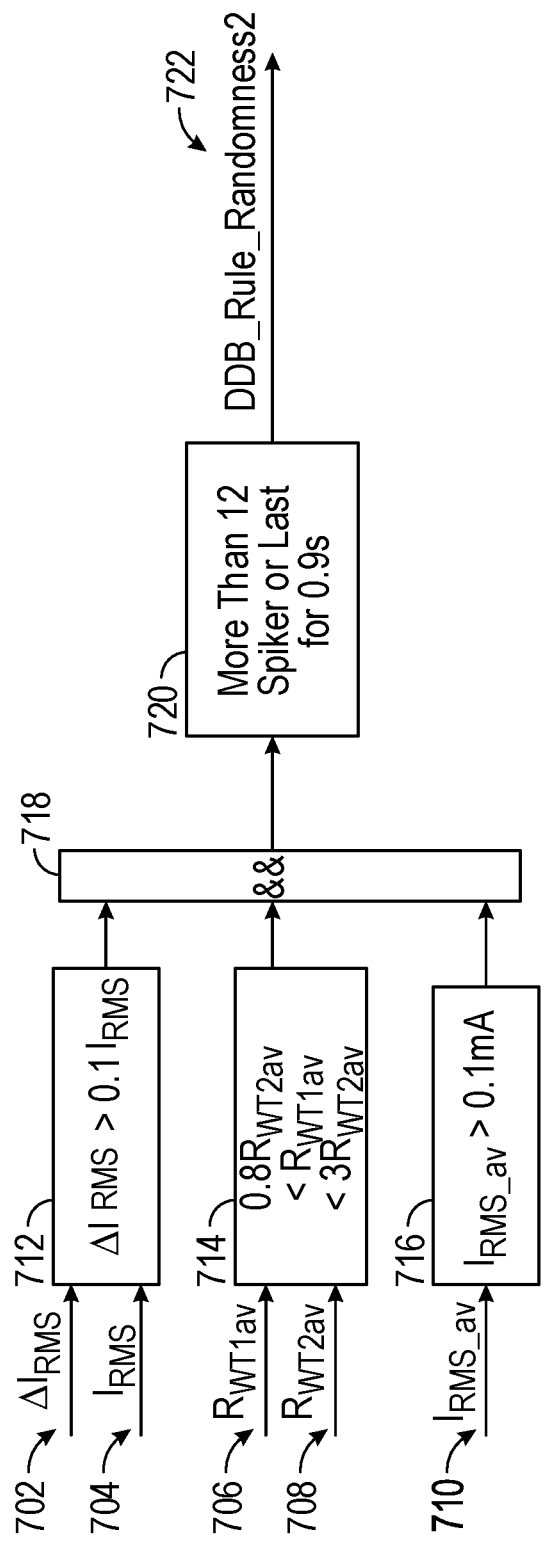
FIG. 7 is a schematic diagram illustrating another example flow diagram, in accordance with one or more example embodiments of the disclosure.

FIG. 7 is a schematic diagram illustrating an example flow diagram 700, in accordance with one or more example embodiments of the disclosure. Particularly, the flow diagram 700 may represent the "randomness 2" rule (for example, the second rule) as described above and depicted in FIG. 3. The flow diagram 700 may include one or more inputs (for example, inputs 702-710), one or more conditions (for example, conditions 712-720), and an output (for example, output 722). The flow diagram 700 may involve the following logic. First, condition 712 may receive inputs 702 and 704. Input 702 may be a change in RMS current ($\Delta I_{RMS}$). Input 704 may be a single RMS current ($I_{RMS}$). IN condition 712, if $\Delta I_{RMS}$>0.1 $I_{RMS}$, then the condition may be met. Second, condition 714 may receive inputs 706 and 708. Input 706 may include the average wavelet energy ratio 1 and input 708 may include the average wavelet energy ratio 2. Condition 714 may involve determining if the average wavelet energy ratio 1 is larger than 0.8 times of average wavelet energy ratio 2 and less than three times the average energy ratio 2. Third, condition 716 may receive input 710. Input 710 may include an average value of $I_{RMS}$. Condition 716 may involve determining if the average value of $I_{RMS}$ is larger than 0.1 mA. Conditions 712, 714, and 716 may be inputs to condition 720. Condition 720 may involve determining that condition 718 lasts for sufficient time (for example, 0.9 s, or any other amount of time) or these conditions appear more than sufficient times (for example, 12 times), then it is determined as arcing fault by rule randomness 2. The DDB_Rule_Randomness2=1 (for example, the output may be equal to one). In this case, the output of 1 may indicate that an arcing fault may exist. However, as aforementioned, the output may not necessarily be a "1" or a "0," but may also be a boolean value, a string, a decimal value, a percentage, or any other output. This may also apply to any of the outputs from any of the five other rules described herein.

Figure 8:
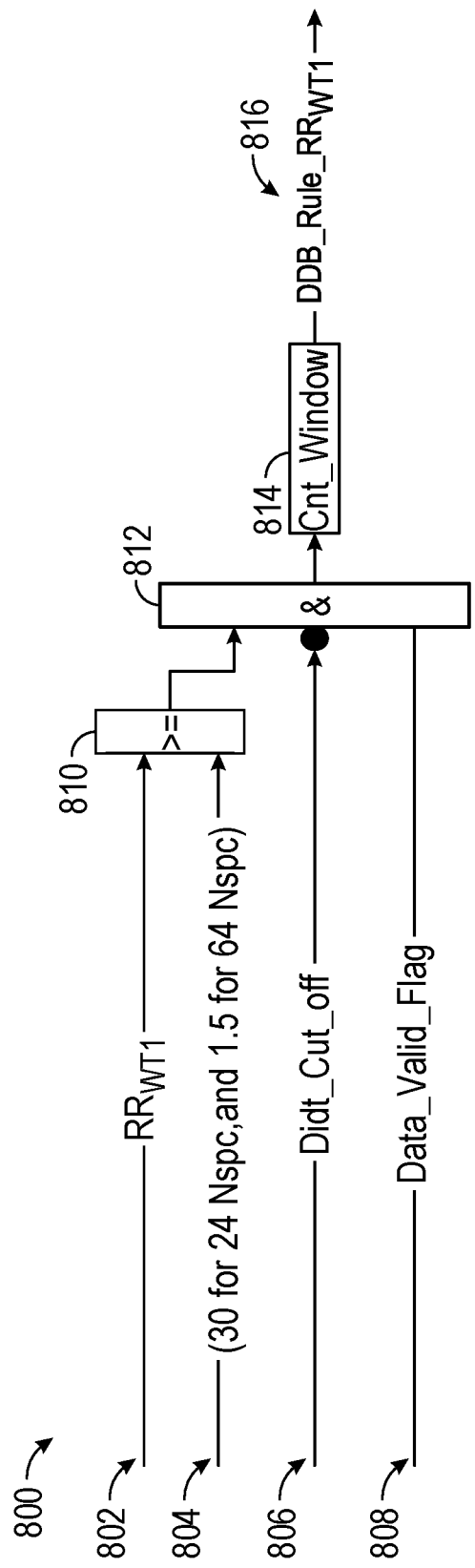
FIG. 8 is a schematic diagram illustrating another example flow diagram, in accordance with one or more example embodiments of the disclosure.

FIG. 8 is a schematic diagram illustrating an example flow diagram 800, in accordance with one or more example embodiments of the disclosure. Particularly, the flow diagram 800 may represent the "randomness 3" rule (for example, the third rule) as described above and depicted in FIG. 3. The flow diagram 800 may include or more inputs (for example, inputs 802-808), one or more conditions (for example, conditions 810-814), and an output (for example, output 816). The logic of the flow diagram 800 may include the following. First, condition 810 may involve determining if wavelet-energy-ratio (scale 1) based relative randomness, $RR_{WT1}$, (input 802) is larger than 30 for the sampling rate which is 24 samples per cycle, or larger than 1.5 for sampling rate that is 64 samples per cycle (input 804). Second, condition 812 may involve determining if condition 810 is met, a Didt_Cut_Off value is not a particular value (that is, $dI_{RMS}$ not within [0.5, 1.0] and [−1.0, −0.5], similar to FIG. 6), and a Data_Valid_Flag value is a particular value (which may indicate that the data is effective). Finally, if condition 814 is met (these prior conditions are maintained for a sufficient period of time, then it is determined as an arcing fault. Again, in this case, the output of 1 may indicate that an arcing fault may exist. However, as aforementioned, the output may not necessarily be a "1" or a "0," but may also be a boolean value, a string, a decimal value, a percentage, or any other output. This may also apply to any of the outputs from any of the five other rules described herein.

Figure 9:
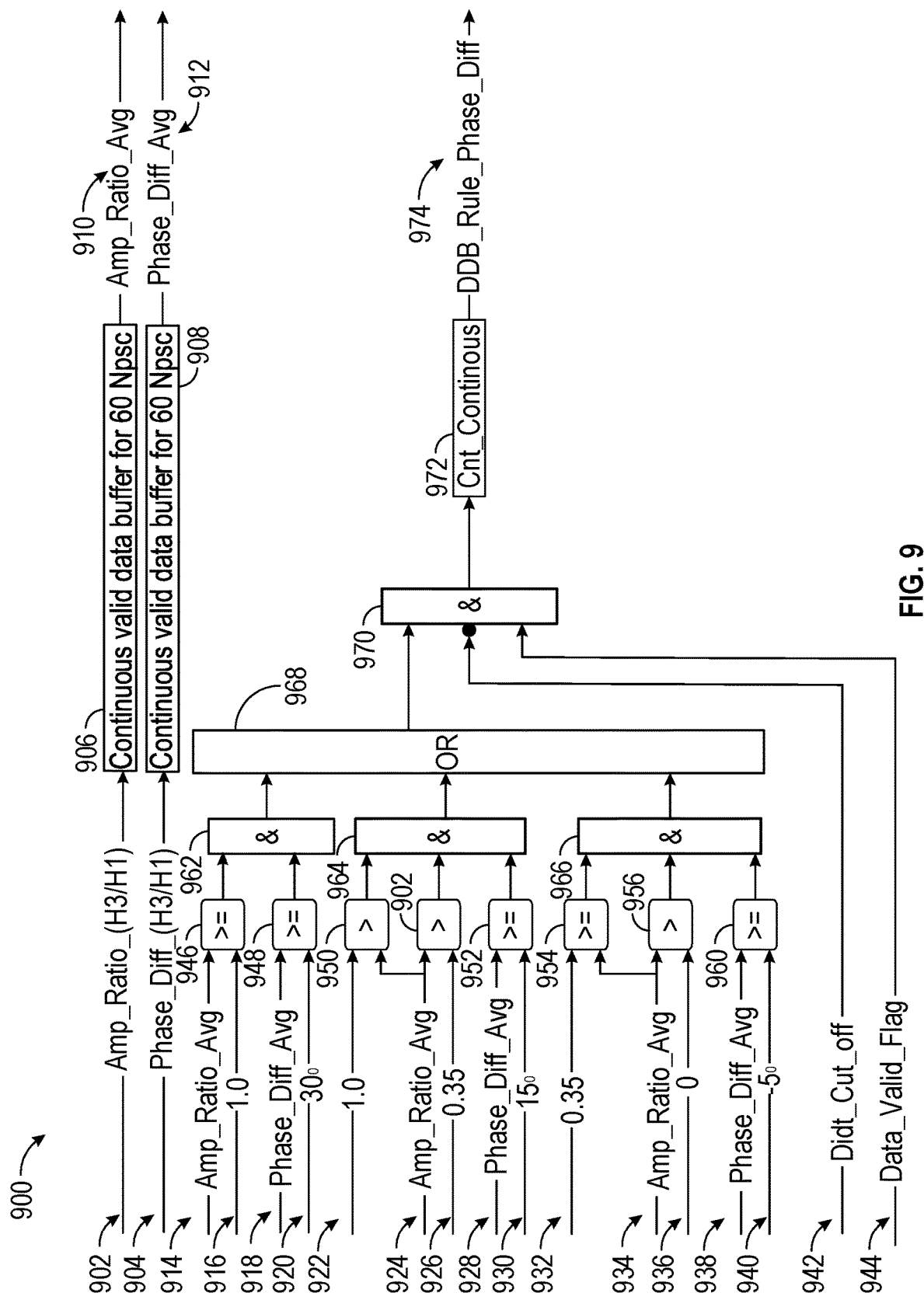
FIG. 9 is a schematic diagram illustrating another example flow diagram, in accordance with one or more example embodiments of the disclosure.

FIG. 9 is a schematic diagram illustrating an example flow diagram 900, in accordance with one or more example embodiments of the disclosure. Particularly, the flow diagram 900 may represent the zero-crossing phase difference rule (for example, the fifth rule) as described above and depicted in FIG. 3. The flow diagram 900 may include one or more inputs (for example, inputs 902-944), one or more conditions (for example, conditions 946-972), and one or more outputs (for example, outputs 910, 912, and 974). The logic of the flow diagram 900 may first involve applying a particular number of cycles (for example, 60 cycles, where one cycle may be 0.02 s for a 50 Hz system, for example, and one cycle may be 0.167 s for a 60 Hz system, for example) on the amplitude ratio of the third harmonic to fundamental frequency, Amp_Ratio_H3_H1, and on the zero-crossing phase difference between third harmonic and fundamental frequency, Phase_Diff_H3_H1. The average of amplitude ratio may be referred to as Amp_Ratio_Avg, the average of phase difference may be referred to as Phase_Diff_Avg.

In some embodiments, the flow diagram 900 may ultimately produce an output 974 indicative of the existence of an arcing fault, or indicative of the lack of an arcing fault, similar the outputs of the other rules. The output 974 may indicate the existence of an arcing fault is conditions 970 and 972 are met. Condition 970 may include determining that a first input 942 and a second input 944 are received, and that condition 968 is also met. Condition 972 may involve a determination that condition 970 is met for a sufficient amount of time. The first input 942 may be a value indicating that $dI_{RMS}$ not within a particular range of values, such as 0.5 to 1.0 and −1.0 to −0.5 (see FIG. 6, for example). The second input may be a value indicating that the data is effective (for example, based on the "data effectiveness" determinations as described herein. Condition 968 may involve a determination that any of condition 962, condition 964, or condition 966 are met. Condition 962 may involve determining that conditions 946 and 948 are met. Condition 964 may involve determining that conditions 950, 951, and 952 are met. Condition 966 may involve determining that conditions 954, 956, and 960 are met.

Condition 946 may involve determining if Amp_Ratio_Avg is greater than a threshold value (for example, 1.0). Condition 948 may involve determining if Phase_Diff_Avg is greater than a threshold number of degrees (for example, 30 degrees). Condition 950 may involve determining if Amp_Ratio_Avg is greater a given value (for example, 0.35). Condition 952 may involve determining if Phase_Diff_Avg>15 degrees. Condition 954 may involve determining if Amp_Ratio_Avg is less than a given value (for example, 0.35). Condition 956 may involve determining if Amp_Ratio_Avg is greater than a given value (for example, 0.0). Condition 960 may involve determining if Phase_Diff_Avg is greater than a given number of degrees (for example, −5 degrees).

FIG. 10 is a schematic diagram illustrating an example flow diagram 1000, in accordance with one or more example embodiments of the disclosure. Particularly, the flow diagram 1000 may represent the rule for extremely high impedance faults (for example, the sixth rule) as described above and depicted in FIG. 3. The flow diagram 100 may include one or more inputs (for example, inputs 1002-1014), one or more conditions (for example, conditions 1016-1026), and an output (for example, output 1028).

The logical of the flow diagram 100 may include the following. Condition 1016 may involve determining if the amplitude ratio of odd order harmonics to fundamental frequency component Rodd (input 1002) is greater than a given threshold (for example 0.5), which may be the input 1004. Condition 1018 may involve determining if the amplitude ratio of even order harmonics to fundamental frequency component $R_{even}$ (input 1006) is greater than a threshold value (for example, 0.1), which may be the input 1008. Condition 1020 may involve determining if $0.8*R_{WT2av} < R_{WT1av} < 3*R_{WT2av}$, where $R_{WT1av}$ and $R_{WT2av}$ may be inputs 1010 and 1012 respectively. Condition 1022 may involve determining if the amplitude of fundamental frequency (input 1014) is larger than a threshold value (for example, 0.1 mA). If all of these conditions are met (as indicated by condition 1024), and the conditions last for a given period of time (as indicated by condition 1026), then it is determined as an arcing fault in this rule. Although the figure shows a period of 0.8 seconds for condition 1026, any other time period may be applicable as well.

Figure 11:
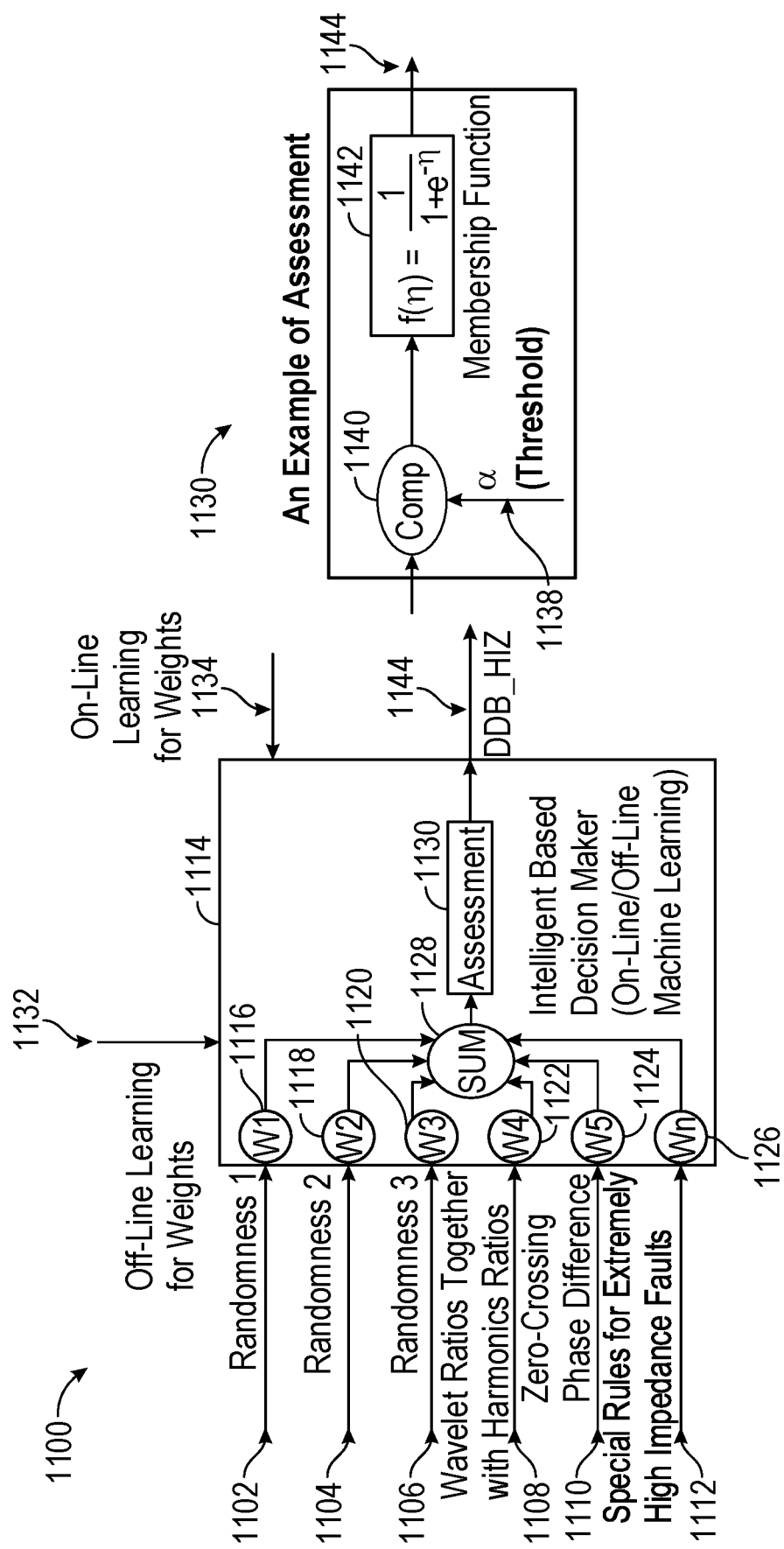
FIG. 11 is a schematic diagram illustrating another example flow diagram, in accordance with one or more example embodiments of the disclosure.

FIG. 11 is a schematic diagram illustrating an example flow diagram 1100, in accordance with one or more example embodiments of the disclosure. Particularly, the flow diagram 1100 may represent another high-level flow diagram similar to the flow diagram 300 of FIG. 3, but including additional details relating to the intelligent decision making block 1114 (operation 316 in FIG. 3). In some embodiments, the intelligence decision making block 1114 may receive as inputs all of the outputs of the various rules described herein. For example, the intelligence decision making block 1114 may receive a first input 1102 corresponding to an output of the first rule (for example, as depicted in FIG. 6), a second input 1104 corresponding to an output of the second rule (for example, as depicted in FIG. 7), a third input 1106 corresponding to an output of the third rule (for example, as depicted in FIG. 8), a fourth input 1108 corresponding to an output of the fourth rule (for example, as depicted in FIG. 9), a fifth input 1110 corresponding to an output of the fifth rule (for example, as depicted in FIG. 10), a sixth input 1112 corresponding to an output of the sixth rule (for example, as depicted in FIG. 9). In some cases, the inputs may include numerical values of "0" or "1." However, in other cases, the inputs may include any other numerical value, or any other type of data, such as a string, boolean value, etc.

In some embodiments, some or all of the inputs to the intelligent decision making block 1114 may be individually weighted. For example, the first input 1102 may be associated with a first weight 1116, the second input 1104 may be associated with a second weight 1118, the third input 1106 may be associated with a third weight 1120, the fourth input 1108 may be associated with a fourth weight 1122, the fifth input 1110 may be associated with a fifth weight 1124, and the sixth input 1112 may be associated with a sixth weight. In some cases, all of the weights applied to the different inputs may be different. However, in some cases, some or all of the different weights may also be the same or similar as well. In some cases, the weights may be numerical values that are multiplied by the different inputs. For example, the first input 1102 may be a value of 1 and the first weight 1116 may be a numerical value of 1.2. In this case, the first input 1102 would be multiplied by the first weight to result in a weighted value of 1.2 for the first input 1102. This is merely one example, and any number of inputs and/or weights may also be applicable. Additionally, the weights may exist in any form other than a numerical value as well.

In some embodiments, once the inputs to the intelligent decision making block 1114 are weighted, a summation 1128 of all of the weighted input values may be performed. The output of the summation 1128 may then be provided to an assessment sub-block 1130 of the intelligent decision making block 1114. In some cases, the assessment sub-block 1130 may involve performing a comparison 1140 between the output of the summation 1128 with a threshold value 1138 (which may be illustrated as "a" in the figure). In some cases, the weighting factors and the threshold value may be determined using artificial intelligence, machine learning, or the like. As one example, there may be a group of known cases that may be used for training purposes. For example, a first case may indicate an arcing fault, a second case may also indicate an arcing fault, and a third case may indicate a lack of an arcing fault. Each case may be associated with an equation, with respect to these unknown parameters. A number of such equations may be used to solve parameters of the weighting factors. This may be an example of supervised machine learning, however, any other form of artificial intelligence, machine learning, or the like may also be used. The output of the intelligent decision making block 1114 may be an indication of whether a fault exists. For example, the output may be in the form of a numerical output, where a value of "1" may indicate a fault and a value of "0" may indicate that a fault may not exist. However, this is merely one non-limiting example, and any other numerical or non-numerical values may be used as well. Additionally, the output may be a fuzzy determination indicating a percentage likelihood that a fault exists. For example, an output of 0.8 may indicate an 80% likelihood that a fault exists.

In such embodiments, artificial intelligence, machine learning, and the like may be used to determine whether a high impedance has taken place. For example, using the artificial intelligence, machine learning, etc., the different rules may be provided different weightings. The intelligent decision making system may be pre-trained with data, and may also be trained in real-time with actual data. For example, the intelligent decision making system may provide an indication of whether a fault has occurred based on actual data, and feedback may be provided to the system in the form of an indication if a fault actually exists. The intelligent decision making system may then use this data to adjust a model used for such determinations (for example, the intelligent decision making system may adjust the weightings provided to the different rules, among any other types of adjustments).

In some embodiments, FIGS. 12-19 may illustrate example algorithms that may be used to determine some or all of the variables used in any of the rules described herein. For example, FIG. 12 may illustrate a first algorithm 1200. The first algorithm 1200 may be used to calculate the energy/RMS of the measured signal in one cycle. The input of the signal, $i_R$, may either be the phase current or the residual current from the core balanced CT, or may be produced by the phase current. The output of the first algorithm may be indicated as $I_{RMS}$, which may be determined using Equation 1 presented below. Additionally, $dI_{RMS}$ (n) may be calculated using Equation 2 shown below.

$$I_{RMS}(n) = \sqrt{\frac{1}{N}\sum_{k=n-N+1}^{n} i^2(n)} \quad \text{(Equation 1)}$$

$$dI_{RMS}(n) = \frac{I_{RMS}(n) - I_{RMS}(n - N_{spc})}{T_0} \quad \text{(Equation 2)}$$

where N may be the window length, for example, number of samples per cycle.

FIG. 13 may illustrate a second algorithm 1300. The input of this second algorithm 1300 may be $I_{RMS}$ which may also be the output of the first algorithm 1200 depicted in FIG. 12. The ΔI may be the increment value of the RMS in one cycle interval, and Δt may be the period. Then ΔI/Δt may be calculated to be the output of this second algorithm 1300 indicated as $dI_{RMS}$ (shown above in Equation 2), which may be a random deviation of RMS current. $z^{-Nspc}$ may refer to delay for Nspc sample, where Nspc is number of samples per-cycle.

FIG. 14 may illustrate a third algorithm 1400. The input of this third algorithm 1400 may be $I_{RMS}$ which may also be the output of the first algorithm 1200 depicted in FIG. 12. The ΔI may be the increment between the present value and the average value in two cycles. Another RMS in two cycles may also be calculated. The final output of the third algorithm 1400 may be a delta of a randomness value, $\Delta I_{RMS}$. This value may be determined using Equation 3 presented below.

$$I_{RMS_{av}}(n) = \frac{N-1}{N} I_{RMS_{av}}(n-1) + I_{RMS}(n) \quad \text{(Equation 3)}$$

where, N may be the window length, here N=2*Nspc, that is, two times of number of samples per cycle. The $\Delta I_{RMS}$ may be calculated using Equation 4 presented below.

$$\Delta I_{RMS} = \sqrt{\frac{1}{N}\sum_{k=n-N+1}^{n} (I_{RMS}(k) - I_{RMS_{av}}(k))^2} \quad \text{(Equation 4)}$$

FIG. 15 may illustrate a fourth algorithm 1500. The fourth algorithm 1500 may involve determining an odd and even harmonics ratio (for example, $R_{odd}$ and $R_{Even}$). This may be beneficial because the arcing fault may cause higher harmonic ratios. The input of the signal $i_R$ could either be the phase current or the residual current from the core balanced CT or produced by the phase current. At block 1502, the dI/dt of the adjacent point may be calculated. This may involve taking the derivative of current samples, and then taking a third harmonic. This may be to amplify the amplitudes of the harmonics. The resulting value may then be divided by the fundamental angular frequency at block 1504. Following block 1504, block 1506 may involve performing a Fourier transform. After the Fourier transform, the amplitude of the fundamental, odd (for example, $3^{rd}$, 5th, 7th, etc.), and even (for example, 2th, 4th, 6th, etc.) may be determined. Then, at block 1508, the ratio of the odd and even referred to the fundamental may be calculated and output as $R_{Odd}$, $R_{Even}$ respectively.

Figure 16:
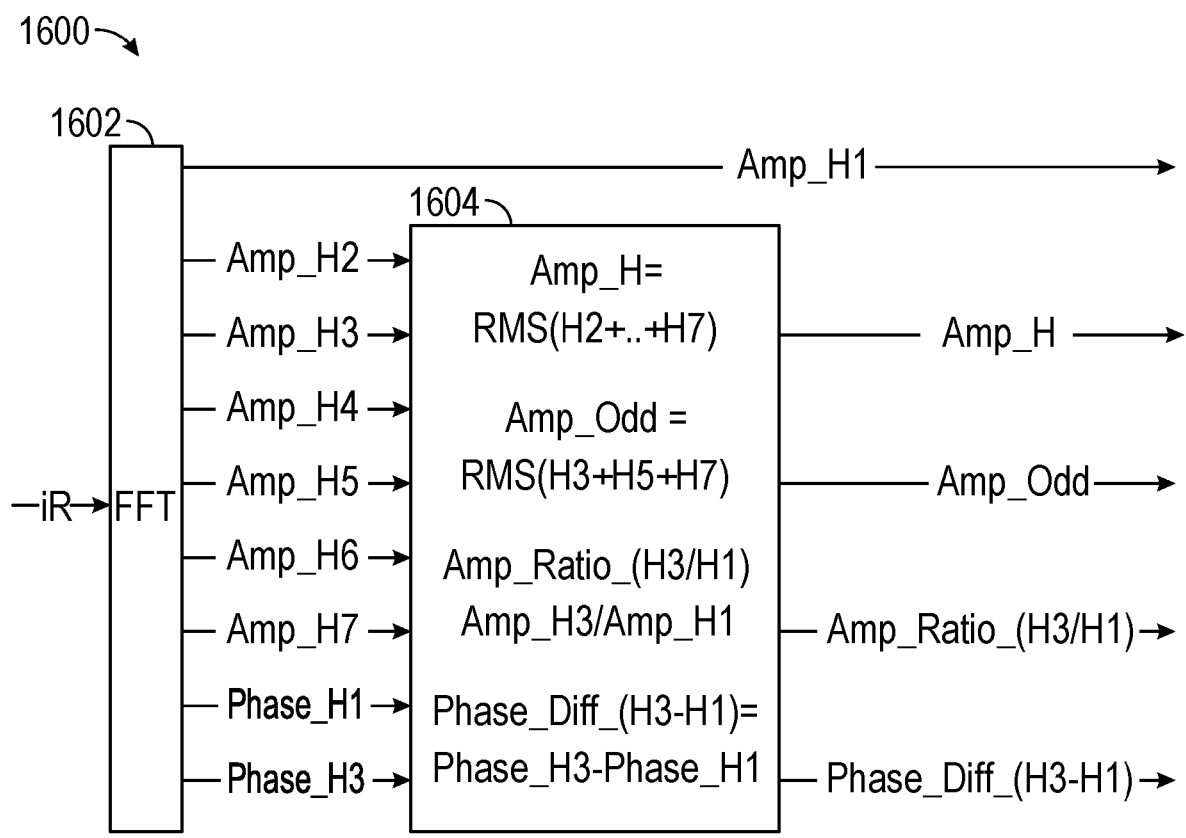
FIG. 16 is a schematic diagram illustrating another example flow diagram, in accordance with one or more example embodiments of the disclosure.

FIG. 16 may illustrate a fifth algorithm 1600. The fifth algorithm 1600 may involve determining normal harmonic amplitude and phase data. Amp_H1 may be the amplitude of fundamental frequency component, from the FFT output. Amp_H may be the sum of all the amplitudes of harmonics, 2nd, 3rd, 4th, 5th, 6th, 7th harmonics. Amp_Odd may be the sum of the amplitudes of odd harmonics, 3, 5, 7 the harmonic. Amp_Ratio_H3_H1 may be the amplitude ratio of 3rd Harmonic to the fundamental frequency. Phase_Diff_H3_H1 may be the phase difference between 3rd harmonic and fundamental frequency. The input of the signal $i_R$ may either be the phase current or the residual current from the core balanced CT or produced by the phase current. At block 1602 of the fifth algorithm 1600, a fast Fourier Transform (FFT) may be applied to the input signal $i_R$. Following this, the amplitudes from fundamental to the 7th harmonic may be calculated. The phase of the fundamental and the 3rd harmonic may be calculated as well. Following this, at block 1604, the equivalent harmonic (for example, 2nd to 7th) amplitude may be calculated as Amp_H, and the equivalent odd harmonic (for example, 3rd, 5th, 7th, etc.) amplitude may be calculated as Amp_Odd. The ratio of the amplitude between the 3rd and fundamental may be calculated as Amp_Ratio_(H3/H1), the phase shift between the 3rd and fundamental at the zero-crossing point of the fundamental may be calculated as Phase_Diff_(H3-H1).

FIG. 17 may illustrate a sixth algorithm 1700. The sixth algorithm 1700 may involve determining wavelet transform and wavelet energy ratio of scales. Three scales of wavelet energy may represent the energy in three adjacent frequency bands (for example, if sampling rate is 3.2 kHz, then, first band may be 0.8-1.6 kHz, second band may be 0.4-0.8 kHz, and the third band may be from 0.2-0.8 Hz). For a non-fault signal, for example, noises, the energy distribution in the three frequency bands may not be consistent or even, however for an arcing fault, the energy distribution may be consistent. In another words, for a noise signal, either R1 may be very small and R2 may be very big, or R1 may be very big and R2 may be very small. However for an arcing fault, value of R1 may be close to value of R2. Therefore a discriminative criterion is defined for identifying fault as 0.8 R2<R1<3*R2, for example. The input of the signal $i_R$ may either be the phase current or the residual current from the core balanced CT or produced by the phase current. At block 1702 of the sixth algorithm 1700, a wavelet transform is used to derive the coefficient at the first three scales $WT_{i1}$, $WT_{i2}$, and $WT_{i3}$. $WT_{i1}$, $WT_{i2}$, and $WT_{i3}$ may be determined using the seventh algorithm 1800 depicted and described with respect to FIG. 18. Following this, block 1704 may involve determining the RMS of the coefficient in two cycles as $I_{WT1}$, $I_{WT2}$, and $I_{WT3}$ (as shown in Equations 5-7. Following this, at block 1706, the ratio between the $I_{WT}$ may be calculated as R1=$I_{WT1}$/$I_{WT2}$, R2=$I_{WT1}$/$I_{WT3}$ (as shown in Equations 8-9). Finally, at block 1708, the average value of R in two cycles may be calculated as $R_{WT1av}$, $R_{WT2av}$ (as shown in Equations 10-11).

$$I_{WT1}(n) = \sqrt{\frac{1}{N}\sum_{k=1}^{N} WT_{i1}(n - N + k)^2} \quad \text{(Equation 5)}$$

$$I_{WT2}(n) = \sqrt{\frac{1}{N}\sum_{k=1}^{N} WT_{i2}(n - N + k)^2} \quad \text{(Equation 6)}$$

$$I_{WT3}(n) = \sqrt{\frac{1}{N}\sum_{k=1}^{N} WT_{i3}(n - N + k)^2} \quad \text{(Equation 7)}$$

-continued $$R_1 = \frac{I_{WT1}}{I_{WT2}} \quad \text{(Equation 8)}$$

$$R_2 = \frac{I_{WT1}}{I_{WT3}} \quad \text{(Equation 9)}$$

$$R_{WT1_{av}}(n) = \frac{N-1}{N} R_{WT1_{av}}(n-1) + \frac{R_1(n)}{N} \quad \text{(Equation 10)}$$

$$R_{WT2_{av}}(n) = \frac{N-1}{N} R_{WT2_{av}}(n-1) + \frac{R_2(n)}{N} \quad \text{(Equation 11)}$$

where N=2Nspc, Nspc is number of samples per cycle.

FIG. 18 may illustrate a seventh algorithm 1800. The seventh algorithm 1800 may first involve determining two sets of coefficients (g(n) and h(n), which may represent low-pass and high-pass filter coefficients of corresponding wavelets, respectively. The logic of the seventh algorithm 1800 may involve the following. First, a signal may be passed through h(n), which may allow the first scale wavelet transform, $WTi_1$, to be determined. Second, a signal may be passed through g(n), and a down sampling of a half sampling rate of previous signal may be performed. The down sampled data may then be passed through h(n) to determine the second scale wavelet transform $WTi_2$. Third, the down sampled data may be passed though g(n) again, half down-sampled again, and subsequently passed through h(n) to determine the third scale wavelet transform $WTi_3$.

Figure 19:
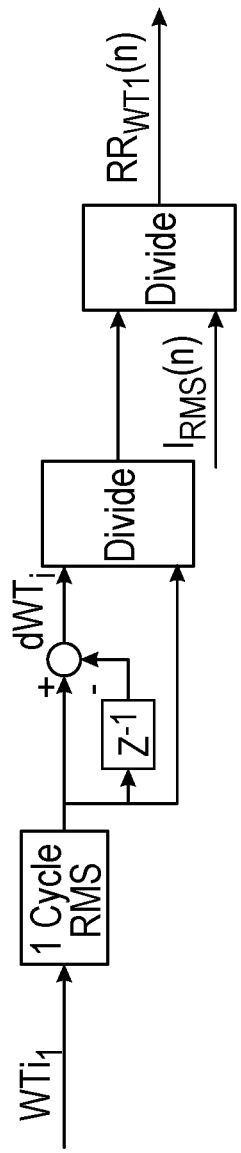
FIG. 19 is a schematic diagram illustrating another example flow diagram, in accordance with one or more example embodiments of the disclosure.

FIG. 19 may illustrate an eighth algorithm 1900. The eighth algorithm 1900 may involve determining wavelet energy relative randomness ($RR_{WT1}(n)$). RRWT1 may be the ratio of the deviation of RMS of scale 1 wavelet transform compared to both the RMS of scale 1 and RMS of overall signal. This ratio may reflect the degree of the deviation of Scale 1 RMS value. If the ratio is large enough, it may indicate an arcing fault. If it is a noise, then the deviation of scale 1 RMS value may either be much less than RMS of scale 1, or may be much less than overall RMS value of input current. The input to the eighth algorithm 1900 may be the coefficient of the first scale after the wavelet transform, which may be indicated as $WT_{i1}$. The RMS in one cycle may be calculated and the increment of its adjacent may be calculated as $dWT_i$. The relative randomness referred to the RMS of coefficient itself may be derived. After this, the relative randomness may be referred to the RMS of the original signal to get the output of $RR_{WT1}$. The logic of the eighth algorithm 1900 may include the following. First, at block 1902, one cycle RMS may be applied on the first scale wavelet transform, which may be determined using Equation 12.

$$I_{WT1}(n) = \sqrt{\frac{1}{N} \sum_{k=1}^{N} WT_{i1}(n-N+k)^2} \quad \text{(Equation 12)}$$

where N=Nspc, which may be the number of samples per cycle.

Second, block 1904 may involve taking a differential of $I_{WT1}$, which may be determined using Equation 13.

$$dI_{WT1}(n) = I_{WT1}(n) - I_{WT1}(n-1) \quad \text{(Equation 13)}$$

Block 1906 may involve dividing $dI_{WT1}$ by $I_{WT1}$, which may be shown by Equation 14 presented below.

$$R_{dIWT1}(n) = \frac{dI_{WT1}(n)}{I_{WT1}} \quad \text{(Equation 14)}$$

Block 1908 may involve dividing $R_{DIWT1}$ by $I_{RMS}$, which may be shown by Equation 15 presented below.

$$RR_{WT1}(n) = \frac{R_{DIWT1}}{I_{RMS}} \quad \text{(Equation 15)}$$

Figure 20:
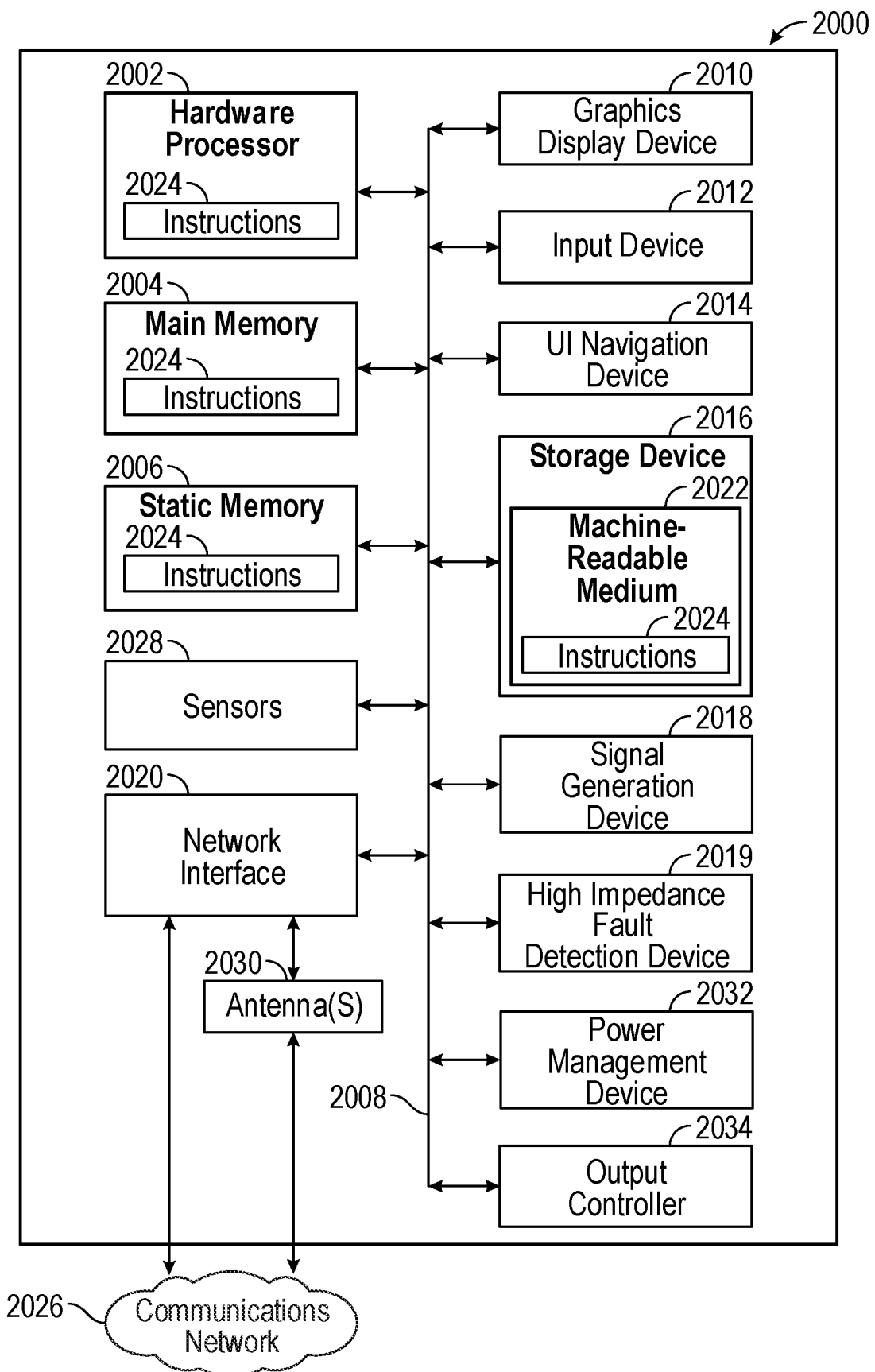
FIG. 20 is a block diagram of an example of a machine or system for high impedance detection in accordance with one or more example embodiments of the disclosure.

FIG. 20 is a block diagram of an example of a machine or system 2000 for high impedance fault detections in accordance with one or more example embodiments of the disclosure.

In other embodiments, the machine 2000 may operate as a standalone device or may be connected (e.g., networked) to other machines. In a networked deployment, the machine 2000 may operate in the capacity of a server machine, a client machine, or both in server-client network environments. In an example, the machine 2000 may act as a peer machine in peer-to-peer (P2P) (or other distributed) network environments. The machine 2000 may be a server (e.g., a real-time server), a computer, an automation controller, a network router, a switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), or other computer cluster configurations.

Examples, as described herein, may include or may operate on logic or a number of components, modules, or mechanisms. Modules are tangible entities (e.g., hardware) capable of performing specified operations when operating. A module includes hardware. In an example, the hardware may be specifically configured to carry out a specific operation (e.g., hardwired). In another example, the hardware may include configurable execution units (e.g., transistors, circuits, etc.) and a computer-readable medium containing instructions where the instructions configure the execution units to carry out a specific operation when in operation. The configuration may occur under the direction of the execution units or a loading mechanism. Accordingly, the execution units are communicatively coupled to the computer-readable medium when the device is operating. In this example, the execution units may be a member of more than one module. For example, under operation, the execution units may be configured by a first set of instructions to implement a first module at one point in time and reconfigured by a second set of instructions to implement a second module at a second point in time.

The machine (e.g., computer system) 2000 may include a hardware processor 2002 (e.g., a central processing unit (CPU), a graphics processing unit (GPU), a hardware processor core, or any combination thereof), a main memory 2004 and a static memory 2006, some or all of which may communicate with each other via an interlink (e.g., bus) 2008. The machine 2000 may further include a power management device 2032, a graphics display device 2010, an input device 2012 (e.g., a keyboard), and a user interface (UI) navigation device 2014 (e.g., a mouse). In an example, the graphics display device 2010, input device 2012, and UI navigation device 2014 may be a touch screen display. The machine 2000 may additionally include a storage device (i.e., drive unit) 2016, a signal generation device 2018 (e.g., an emitter, a speaker), a high impedance fault detection device 2019, a network interface device/transceiver 2020 coupled to antenna(s) 2030, and one or more sensors 2028, such as a global positioning system (GPS) sensor, a compass, an accelerometer, or other sensor. The machine 2000 may include an output controller 2034, such as a serial (e.g., universal serial bus (USB), parallel, or other wired or wireless (e.g., infrared (IR), near field communication (NFC), etc.) connection to communicate with or control one or more peripheral devices (e.g., a printer, a card reader, etc.)).

The storage device 2016 may include a machine readable medium 2022 on which is stored one or more sets of data structures or instructions 2024 (e.g., software) embodying or utilized by any one or more of the techniques or functions described herein. The instructions 2024 may also reside, completely or at least partially, within the main memory 2004, within the static memory 2006, or within the hardware processor 2002 during execution thereof by the machine 2000. In an example, one or any combination of the hardware processor 2002, the main memory 2004, the static memory 2006, or the storage device 2016 may constitute machine-readable media.

The high impedance fault detection device 2019 may carry out or perform any of the operations and processes (e.g., the logic diagram 600 of FIG. 6, and/or the process 700 of FIG. 7) described above. The high impedance fault detection device 2019 may be one embodiment of the controller 104/240. For example, the high impedance fault detection device 2019 may include at least the data collector 256, the impedance change ratio calculator 258, the threshold setpoint generator 260, the high impedance fault detector 262, the alarm generator 264, and/or the command generator 266.

While the machine-readable medium 2022 is illustrated as a single medium, the term "machine-readable medium" may include a single medium or multiple media (e.g., a centralized or distributed database, and/or associated caches and servers) configured to store the one or more instructions 2024.

Various embodiments may be implemented fully or partially in software and/or firmware. This software and/or firmware may take the form of instructions contained in or on a non-transitory computer-readable storage medium. Those instructions may then be read and executed by one or more processors to enable performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read only memory (ROM); random access memory (RAM); magnetic disk storage media; optical storage media; a flash memory, etc.

The term "machine-readable medium" may include any medium that is capable of storing, encoding, or carrying instructions for execution by the machine 2000 and that cause the machine 2000 to perform any one or more of the techniques of the present disclosure, or that is capable of storing, encoding, or carrying data structures used by or associated with such instructions. Non-limiting machine-readable medium examples may include solid-state memories and optical and magnetic media. In an example, a massed machine-readable medium includes a machine-readable medium with a plurality of particles having resting mass. Specific examples of massed machine-readable media may include non-volatile memory, such as semiconductor memory devices (e.g., electrically programmable read-only memory (EPROM), or electrically erasable programmable read-only memory (EEPROM)) and flash memory devices; magnetic disks, such as internal hard disks and removable disks; magneto-optical disks; and CD-ROM and DVD-ROM disks. [00%] The instructions 2024 may further be transmitted or received over a communications network 2026 using a transmission medium via the network interface device/transceiver 2020 utilizing any one of a number of transfer protocols (e.g., frame relay, internet protocol (IP), transmission control protocol (TCP), user datagram protocol (UDP), hypertext transfer protocol (HTTP), etc.). Example communications networks may include a local area network (LAN), a wide area network (WAN), a packet data network (e.g., the Internet), mobile telephone networks (e.g., cellular networks), plain old telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, the network interface device/transceiver 2020 may include one or more physical jacks (e.g., Ethernet, coaxial, or phone jacks) or one or more antennas to connect to the communications network 2026. In an example, the network interface device/transceiver 2020 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 2000 and includes digital or analog communications signals or other intangible media to facilitate communication of such software.

The operations and processes described and shown above may be carried out or performed in any suitable order as desired in various implementations. Additionally, in certain implementations, at least a portion of the operations may be carried out in parallel. Furthermore, in certain implementations, less than or more than the operations described may be performed.

The word "exemplary" is used herein to mean "serving as an example, instance, or illustration." Any embodiment described herein as "exemplary" is not necessarily to be construed as preferred or advantageous over other embodiments. The terms "monitoring and computing device," "user device," "communication station," "station," "handheld device," "mobile device," "wireless device" and "user equipment" (UE) as used herein refers to a wireless communication device such as a cellular telephone, a smartphone, a tablet, a netbook, a wireless terminal, a laptop computer, a femtocell, a high data rate (HDR) subscriber station, an access point, a printer, a point of sale device, an access terminal, or other personal communication system (PCS) device. The device may be either mobile or stationary.

As used within this document, the term "communicate" is intended to include transmitting, or receiving, or both transmitting and receiving. This may be particularly useful in claims when describing the organization of data that is being transmitted by one device and received by another, but only the functionality of one of those devices is required to infringe the claim. Similarly, the bidirectional exchange of data between two devices (both devices transmit and receive during the exchange) may be described as "communicating," when only the functionality of one of those devices is being claimed. The term "communicating" as used herein with respect to a wireless communication signal includes transmitting the wireless communication signal and/or receiving the wireless communication signal. For example, a wireless communication unit, which is capable of communicating a wireless communication signal, may include a wireless transmitter to transmit the wireless communication signal to at least one other wireless communication unit, and/or a wireless communication receiver to receive the wireless communication signal from at least one other wireless communication unit.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

Some embodiments may be used in conjunction with various devices and systems, for example, a personal computer (PC), a desktop computer, a mobile computer, a laptop computer, a notebook computer, a tablet computer, a server computer, a handheld computer, a handheld device, a personal digital assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a video device, an audio device, an audio-video (AN) device, a wired or wireless network, a wireless area network, a wireless video area network (WVAN), a local area network (LAN), a wireless LAN (WLAN), a personal area network (PAN), a wireless PAN (WPAN), and the like.

It is understood that the above descriptions are for purposes of illustration and are not meant to be limiting.

Although specific embodiments of the disclosure have been described, numerous other modifications and alternative embodiments are within the scope of the disclosure. For example, any of the functionality described with respect to a particular device or component may be performed by another device or component. Further, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments may not include, certain features, elements, and/or steps. Thus, such conditional language is not generally intended to imply that features, elements, and/or steps are in any way required for one or more embodiments.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database task or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program modules, or other data transmitted within a data signal, such as a carrier wave, or other transmission. However, as used herein, CRSM does not include CRCM.

That which is claimed is:

1. A method comprising:
    calculating, by a processor, a relative randomness of a signal, wherein the relative randomness is a derivative of a first scale wavelet transform divided by an energy of the signal;
    calculating, by the processor, one or more scales of a wavelet transform of the signal;
    calculating, by the processor, one or more energy ratios between energy of the wavelet transform in the one or more scales;
    calculating, by the processor, a zero-crossing phase difference between a third harmonic and a fundamental component of the signal;
    determining, by the processor, that a high impedance fault occurs based on at least one of: the relative randomness, a comparison between the one or more scales of the wavelet transform, and the zero-crossing phase difference;
    receiving a first signal from an intelligent electronic device located at a feeder head of a distribution system; and
    applying one or more filters to filter out noise and signals generated by normal operations from the first signal to generate a filtered signal;
    wherein the signal comprises the filter signal.

2. The method of claim 1, further comprising:
    calculating, by the processor, a first randomness by taking a derivative of an energy of a phase current or residual current of the signal,
    wherein determining that the high impedance fault occurs is further based on the first randomness.

3. The method of claim 1, further comprising:
    calculating, by the processor, a second randomness by applying a band-pass filter onto an energy of a phase current or residual current of the signal,
    wherein determining that the high impedance fault occurs is further based on the second randomness.

4. The method of claim 1, further comprising:
    calculating a first ratio of a first scale of the one or more scales of the wavelet transform to a second scale of the wavelet transform; and
    calculating a second ratio of the second scale of the one or more scales of the wavelet transform to a third scale of the wavelet transform,
    wherein determining that the high impedance fault occurs is further based on the first ratio and the second ratio.

5. The method of claim 1, wherein calculating the zero-crossing phase difference comprises:
    calculating an odd and even harmonic ratios to the fundamental component.

6. The method of claim 1, wherein determining that the high impedance fault occurs comprises:
    determining respective weights for each of the relative randomness, the one or more scales of the wavelet transform, and the zero-crossing phase difference;
    determining that each of the respective weights exceeds a threshold; and
    determining that the high impedance fault occurs based on each of the respective weights exceeding the threshold.

7. The method of claim 6, wherein determining the respective weights comprises:
    training a machine learning model using online data and offline data; and
    inputting the relative randomness, the one or more scales of the wavelet transform, and the zero-crossing phase difference into the machine learning model,
    wherein determining that the high impedance fault occurs is based on the machine learning model.

8. The method of claim 7, wherein the online data is obtained from a feedback of an occurrence of high impedance fault.

9. The method of claim 1, further comprising:
    sending an alarm signal indicative of an occurrence of the high impedance fault to one or more monitoring and computing devices; and
    performing one or more corrective actions in response to the occurrence of the high impedance fault.

10. A system comprising:
    a computer processor operable to execute a set of non-transitory computer-readable instructions; and
    a memory operable to store the set of non-transitory computer-readable instructions operable to:
        calculate, by a processor, a relative randomness of a signal, wherein the relative randomness is a derivative of a first scale wavelet transform divided by an energy of the signal;
        calculate, by the processor, one or more scales of a wavelet transform of the signal;
        calculate, by the processor, one or more energy ratios between energy of the wavelet transform in the one or more scales;
        calculate, by the processor, a zero-crossing phase difference between a third harmonic and a fundamental component of the signal;
        determine, by the processor, that a high impedance fault occurs based on at least one of: the relative randomness, a comparison between the one or more scales of the wavelet transform, and the zero-crossing phase difference;
        receive a first signal from an intelligent electronic device located at a feeder head of a distribution system; and
        apply one or more filters to filter out noise and signals generated by normal operations from the first signal to generate a filtered signal;
        wherein the signal comprises the filter signal.

11. The system of claim 10, wherein the non-transitory computer-readable instructions are further operable to:
    calculate, by the processor, a first randomness by taking a derivative of an energy of a phase current or residual current of the signal,
    wherein determining that the high impedance fault occurs is further based on the first randomness.

12. The system of claim 10, wherein the non-transitory computer-readable instructions are further operable to:
    calculate, by the processor, a second randomness by applying a band-pass filter onto an energy of a phase current or residual current of the signal, wherein determining that the high impedance fault occurs is further based on the second randomness.

13. The system of claim 10, wherein the non-transitory computer-readable instructions are further operable to:
calculate a first ratio of a first scale of the one or more scales of the wavelet transform to a second scale of the wavelet transform; and
calculate a second ratio of the second scale of the one or more scales of the wavelet transform to a third scale of the wavelet transform;
wherein determining that the high impedance fault occurs is further based on the first ratio and the second ratio.

14. The system of claim 10, wherein calculating the zero-crossing phase difference comprises:
calculate an odd and even harmonic ratios to the fundamental component.

15. The system of claim 10, wherein determining that the high impedance fault occurs comprises:
determine respective weights for each of the relative randomness, the one or more scales of the wavelet transform, and the zero-crossing phase difference;
determine that each of the respective weights exceeds a threshold; and
determine that the high impedance fault occurs based on each of the respective weights exceeding the threshold.

16. The system of claim 15, wherein determining the respective weights comprises:
train a machine learning model using online data and offline data; and
input the relative randomness, the one or more scales of the wavelet transform, and the zero-crossing phase difference into the machine learning model,
wherein determining that the high impedance fault occurs is based on the machine learning model.

17. The system of claim 16, wherein the online data is obtained from a feedback of an occurrence of a high impedance fault.

18. The system of claim 10, wherein the non-transitory computer-readable instructions are further operable to:
send an alarm signal indicative of an occurrence of the high impedance fault to one or more monitoring and computing devices; and
perform one or more corrective actions in response to the occurrence of the high impedance fault.

* * * * *